US012748142B2

(12) United States Patent
Goergen et al.

(10) Patent No.: US 12,748,142 B2
(45) Date of Patent: Sep. 29, 2026

(54) USING IMPEDANCE ANALYSIS FOR FAULT DETECTION IN POWER DELIVERY SYSTEMS

(71) Applicant: Cisco Technology, Inc., San Jose, CA (US)

(72) Inventors: Joel Richard Goergen, Soulsbyville, CA (US); Emanuele Croci, Carate Brianza (IT); Raghav N. Narasimhan, Fremont, CA (US); Matthew C. Stroud, Allen, TX (US); Kameron Rose Hurst, Sonora, CA (US); Sean C. Pegado, Washington, DC (US); George Allan Zimmerman, Manhattan Beach, CA (US); Rajeshwari Gangapur, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 135 days.

(21) Appl. No.: 18/611,838

(22) Filed: Mar. 21, 2024

(65) Prior Publication Data

US 2025/0283931 A1 Sep. 11, 2025

Related U.S. Application Data

(60) Provisional application No. 63/561,369, filed on Mar. 5, 2024.

(51) Int. Cl.
*G01R 31/02* (2006.01)
*G01R 31/08* (2020.01)

(52) U.S. Cl.
CPC ......... *G01R 31/088* (2013.01); *G01R 31/085* (2013.01)

(58) Field of Classification Search
CPC .... G01R 31/085; G01R 31/088; G01R 31/52; G01R 31/58
See application file for complete search history.

(56) References Cited

U.S. PATENT DOCUMENTS 9,588,169 B1 3/2017 Watkins et al.
9,838,679 B2 * 12/2017 Harris ...................... H04B 3/46
(Continued)

FOREIGN PATENT DOCUMENTS

CA 2907434 C 11/2021
CN 107290632 A 10/2017
(Continued)

OTHER PUBLICATIONS

International Search Report and Written Opinion for International Application No. PCT/US2025/017274, mailed May 7, 2025, 14 pages.
(Continued)

*Primary Examiner* — Thang X Le
(74) *Attorney, Agent, or Firm* — Edell, Shapiro & Finnan, LLC

(57) ABSTRACT

Techniques for detecting an impedance-based fault on a wire carrying power in a power delivery system. The techniques involve applying power to a wire of a power delivery system and applying onto the wire a chirp pulse comprising a sequence of waveforms of a plurality of frequencies. A signal is obtained from the wire. An impedance of the signal is analyzed at two or more frequencies of the plurality of frequencies with respect to a reference impedance to determine whether there is an indication of an impedance-based fault associated on the wire, such as a human touching the wire. The power to the wire is disconnected in response to determining an indication of the impedance-based fault.

34 Claims, 24 Drawing Sheets

(56) References Cited

U.S. PATENT DOCUMENTS

| | | | | |
|---|---|---|---|---|
| 10,958,471 | B2 * | 3/2021 | Goergen | H04L 12/40039 |
| 11,063,630 | B2 | 7/2021 | Arduini et al. | |
| 11,709,194 | B2 * | 7/2023 | Li | H02H 7/22 361/78 |
| 12,126,399 | B2 | 10/2024 | Arduini et al. | |
| 2005/0171647 | A1 * | 8/2005 | Kunsman | H02H 1/0092 700/293 |
| 2011/0227582 | A1 | 9/2011 | Ahamed et al. | |
| 2011/0313691 | A1 | 12/2011 | Dobson et al. | |
| 2013/0103220 | A1 | 4/2013 | Eaves | |
| 2013/0181969 | A1 * | 7/2013 | Kishi | G09G 3/3233 345/212 |
| 2015/0212025 | A1 | 7/2015 | Francis-Buller et al. | |
| 2017/0034507 | A1 * | 2/2017 | Harris | H04B 3/46 |
| 2017/0199235 | A1 * | 7/2017 | Jeon | G01R 31/11 |
| 2018/0004276 | A1 | 1/2018 | Wong et al. | |
| 2018/0157284 | A1 | 6/2018 | Ewing et al. | |
| 2019/0079131 | A1 | 3/2019 | Pinhasi et al. | |
| 2021/0055357 | A1 * | 2/2021 | Yeh | G01R 31/58 |
| 2021/0111938 | A1 | 4/2021 | Sahin et al. | |
| 2021/0333858 | A1 | 10/2021 | Hazani | |
| 2022/0050135 | A1 | 2/2022 | Nordin et al. | |
| 2023/0040178 | A1 | 2/2023 | Potterf et al. | |
| 2023/0040876 | A1 | 2/2023 | Potterf et al. | |
| 2023/0090349 | A1 | 3/2023 | Filipetti et al. | |
| 2023/0221380 | A1 | 7/2023 | Shea et al. | |
| 2023/0223988 | A1 | 7/2023 | Arduini et al. | |
| 2024/0275623 | A1 | 8/2024 | Goergen et al. | |
| 2024/0339825 | A1 | 10/2024 | Telefus et al. | |
| 2024/0421593 | A1 | 12/2024 | Shea et al. | |

FOREIGN PATENT DOCUMENTS

| | | | |
|---|---|---|---|
| CN | 113466589 | A | 10/2021 |
| KR | 20220075994 | A | 6/2022 |

OTHER PUBLICATIONS

Lee C-K., et al., "Condition Assessment of I&C Cables in Nuclear Power Plants via Stepped-Frequency Waveform Reflectometry", IEEE Transactions on Instrumentation and Measurement, IEEE, USA, vol. 68, No. 1, XP011699010, ISSN: 0018-9456, DOI: 10.1109/TIM.2018.2834179, Jan. 1, 2019, pp. 215-224.

Beaudart C., et al., "Equation Models Developed with Bioelectric Impedance Analysis Tools to Assess Muscle Mass: A Systematic Review," Clinical Nutrition ESPEN, vol. 35, https://www.sciencedirect.com/science/article/pii/S2405457719304784, Feb. 2020, 16 pages.

Khalil S.F., et al., "The Theory and Fundamentals of Bioimpedance Analysis in Clinical Status Monitoring and Diagnosis of Diseases," Sensors, vol. 14, https://www.mdpi.com/1424-8220/14/6/10895, Jun. 19, 2014, 34 pages.

Reis J., et al., "Sequence and Spread Spectrum Time Domain Reflectometry for Transmission Line Analysis," Conference: Proceedings of SPIE, https://www.researchgate.net/publication/230743782_Sequence_and_spread_spectrum_time_domain_reflectometry_for_transmission_line_analysis, Sep. 10, 2007, 12 pages.

Bocquet W., et al., "Power Distribution Methods for MIMO-OFDM Systems and Field Experimentations," Wireless Communications and Mobile Computing, vol. 9, No. 12, Dec. 2009, 11 pages.

* cited by examiner

315

USING IMPEDANCE ANALYSIS FOR FAULT DETECTION IN POWER DELIVERY SYSTEMS

CROSS REFERENCE TO RELATED APPLICATION

This application claims priority to U.S. Provisional Application No. 63/561,369, filed Mar. 5, 2024, the entirety of which is incorporated herein by reference.

TECHNICAL FIELD

The present disclosure relates to power distribution.

BACKGROUND

Present power fault methods for AC power systems rely on circuit breaker devices to trip faults. For fault managed power systems, a set of field effect transistors (FETs) are used to shut off power briefly in order to allow for fault detection. These brief interruptions result in a small observable power loss, but they allow fault detection circuitry to measure the line and any faults, and interrupt the power to prevent electrical hazards such as fire or shock to persons contacting the wire. Fault managed power fault detection circuitry can reduce power transfer efficiency, consume significant space, use many components, be quite costly for enterprise applications, and create problems when combined with digital communications.

DETAILED DESCRIPTION

Overview

Figure 1:
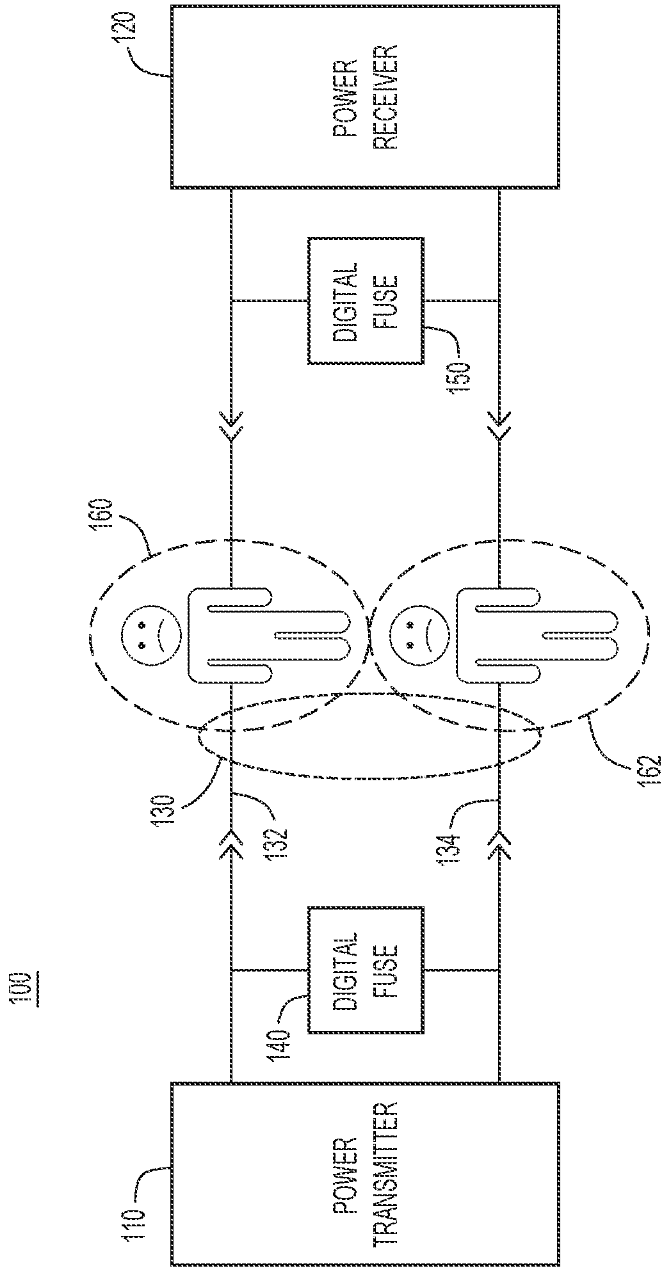
FIG. 1 illustrates a block diagram of a power delivery system that includes a digital fuse at one or both of the power transmitter and power receiver, according to an example embodiment.

Techniques are presented herein for detecting an impedance-based fault on a wire carrying power in a power delivery system. The techniques involve applying power to a wire of a power delivery system and applying onto the wire a pulse comprising a sequence of waveforms of a plurality of frequencies, herein called a “chirp pulse”. A signal on the wire is detected from the chirp pulse. An impedance of the signal is analyzed at two or more frequencies of the plurality of frequencies with respect to a reference impedance to determine whether there is an indication of an impedance-based fault, such as a fault associated with a human touching the wire in the power delivery system. The power from the wire in the power delivery system is disconnected in response to determining an indication of the impedance-based fault.

Example Embodiments

Presented herein are devices, systems and methods to detect a fault condition on a wire/cable carrying power using impedance modeling, by providing a chirp pulse comprising a continuous sequence of waveforms at a plurality of frequencies. These techniques enable what is referred to herein as a "digital fuse" that performs time and frequency analysis of signals on a wire to detect an impedance-based fault, such as a fault caused by a human touching a power line in a power delivery system. A human-being touching a wire would impose a body impedance as an impedance that would vary with frequency and time. Other faults, such as forming arc paths or intermittent grounds, also have time and frequency variant impedance characteristics that can be detected using the techniques presented herein. Still further, the use of a connector in a power delivery system that is not suitable might be another example of a fault that could be detected by impedance analysis on the wire(s). These techniques are useful for any type of time-varying and frequency-dependent impedance-based fault detection as there are many faults on a wire carrying power that can be characterized by this type of time/frequency analysis.

Unlike prior fault managed power techniques that rely on power pulses separated by short periods of no power, the digital fuse and related techniques allow for power (voltage and current) to be turned on and kept continuously on (no power pulses separated by off periods) to thereby realize 100% usability of the power. Power is only shut-down or reset to a startup level when a fault is detected. There are situations in which the impedance-based fault detection techniques can be performed on a wire before there is any power applied to the wire. Nevertheless, these techniques can also be used with pulse power if desired.

The techniques presented herein differ from arc fault circuit interruptions (AFCIs) and ground fault circuit interruptions (GFCIs) in that the presented techniques are not passive (simply monitoring current or voltage) but involve imposing a pulse (chirp pulse) of multiple frequencies onto the wire and making a decision whether to trigger a fault based on monitoring the wire as a result of applying the chirp pulse (in most cases while power is continuously being applied on the wire). AFCI techniques simply monitor current in the power signal for high frequency components. As such, AFCI techniques are passive sensing techniques. In contrast, the techniques presented herein are active sensing techniques that involve sending a pulse (comprising a sequence of waveforms of a plurality of frequencies) onto a wire on which power is being delivered and observing impact to the pulse on the wire as a result of any fault conditions on the wire.

Reference is now made to FIG. 1, which shows a power delivery system 100 that includes a power transmitter 110 and a power receiver 120. The power transmitter 110 may also be referred to as a power source or power source equipment, and the power receiver 120 may also be referred to as a powered device. The power transmitter 110 transmits power over a cable 130 to the power receiver 120. The cable 130 may include a wire pair comprised of a send wire 132 and a return wire 134. It should be understood that the cable 130 may include multiple pairs of send/return wires, but for simplicity only a single pair is shown.

There is a digital fuse 140 at the power transmitter side coupled to the send wire 132 and return wire 134, and a digital fuse 150 at the power receiver side also coupled to the send wire 132 and return wire 134. The components and operations of the digital fuses 140 and 150 are described further below. At a high-level, and as alluded to above, the digital fuses 140 and 150 inject pulses (called "chirp pulses") onto the wires of the cable 130 and analyze signals on the wires to detect whether there is an impedance-based fault on either the send wire 132 or the receive wire 134. FIG. 1 shows an example of a human 160 touching the send wire 132 and a human 162 touching the receive wire, in both instances triggering an impedance-based fault that is detected by either the digital fuse 140 or the digital fuse 150, as explained in more detail below. When a fault is detected by either digital fuse 140 or digital fuse 150, the power transmitter 110 shuts down completely or resets to a restart mode at a predetermined relatively low power, such as 48 volts DC (VDC).

The power transmitter 110 may supply any of a variety of types of power, including 380 VDC, 380 VDC fault managed power (FMP), 48 VDC, 240 volts AC (VAC), 120 VAC, 480/277 VAC, Power over Ethernet (POE), 24 VAC control, and up to, and exceeding, 1000 VDC and 750 VAC. The 380 VDC FMP refers to pulse power delivered in a series of pulses of power spaced by off periods, and during the off periods fault detection techniques may be performed. Thus, the digital fuse techniques may be used for situations where power is continuously applied over a wire as well as to situations in which power is provided in pulses (so-called FMP) separated by off intervals that can be used to perform fault detections.

Figure 2A:
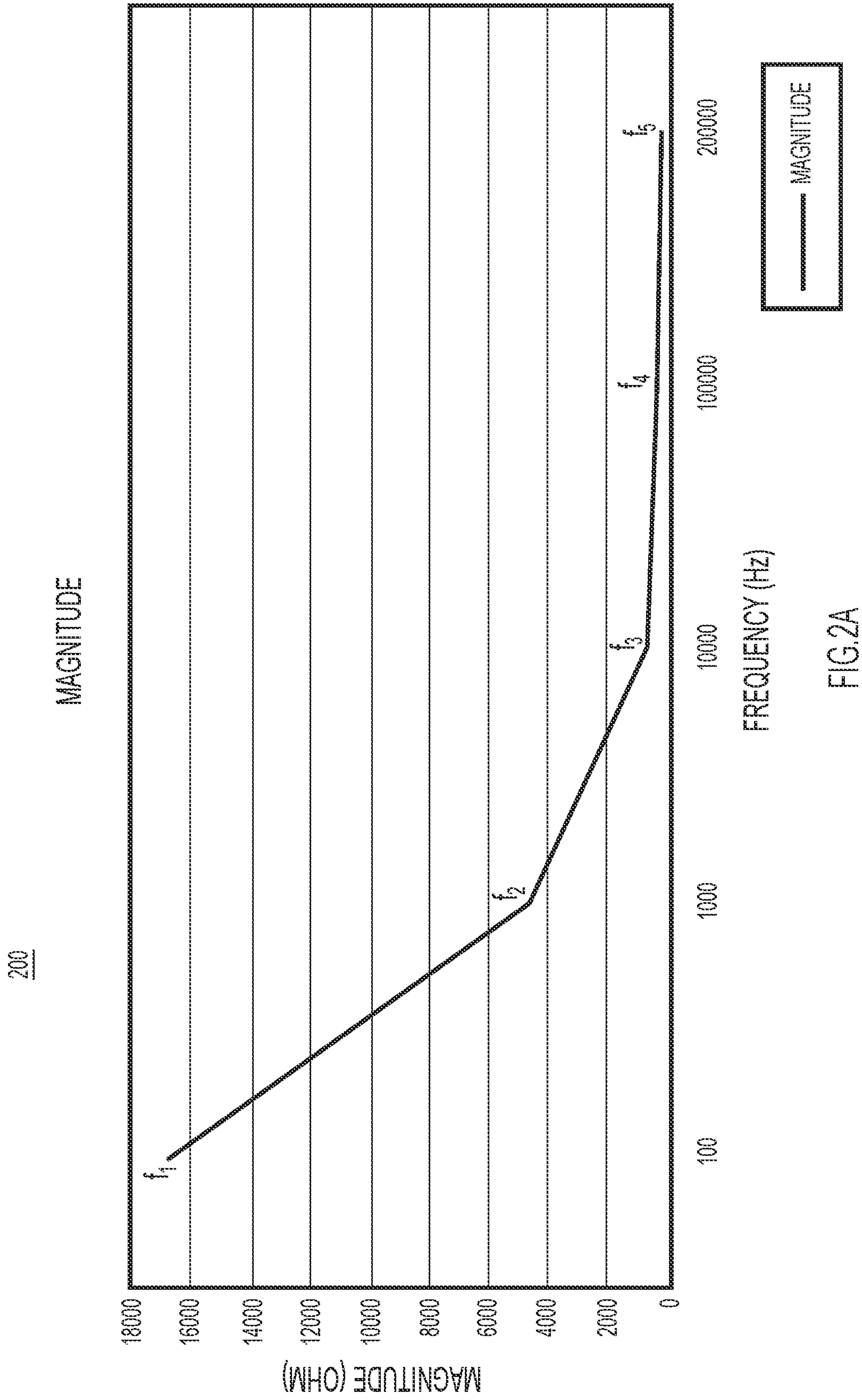
FIG. 2A is a plot of magnitude versus frequency for human body impedance.
Figure 2B:
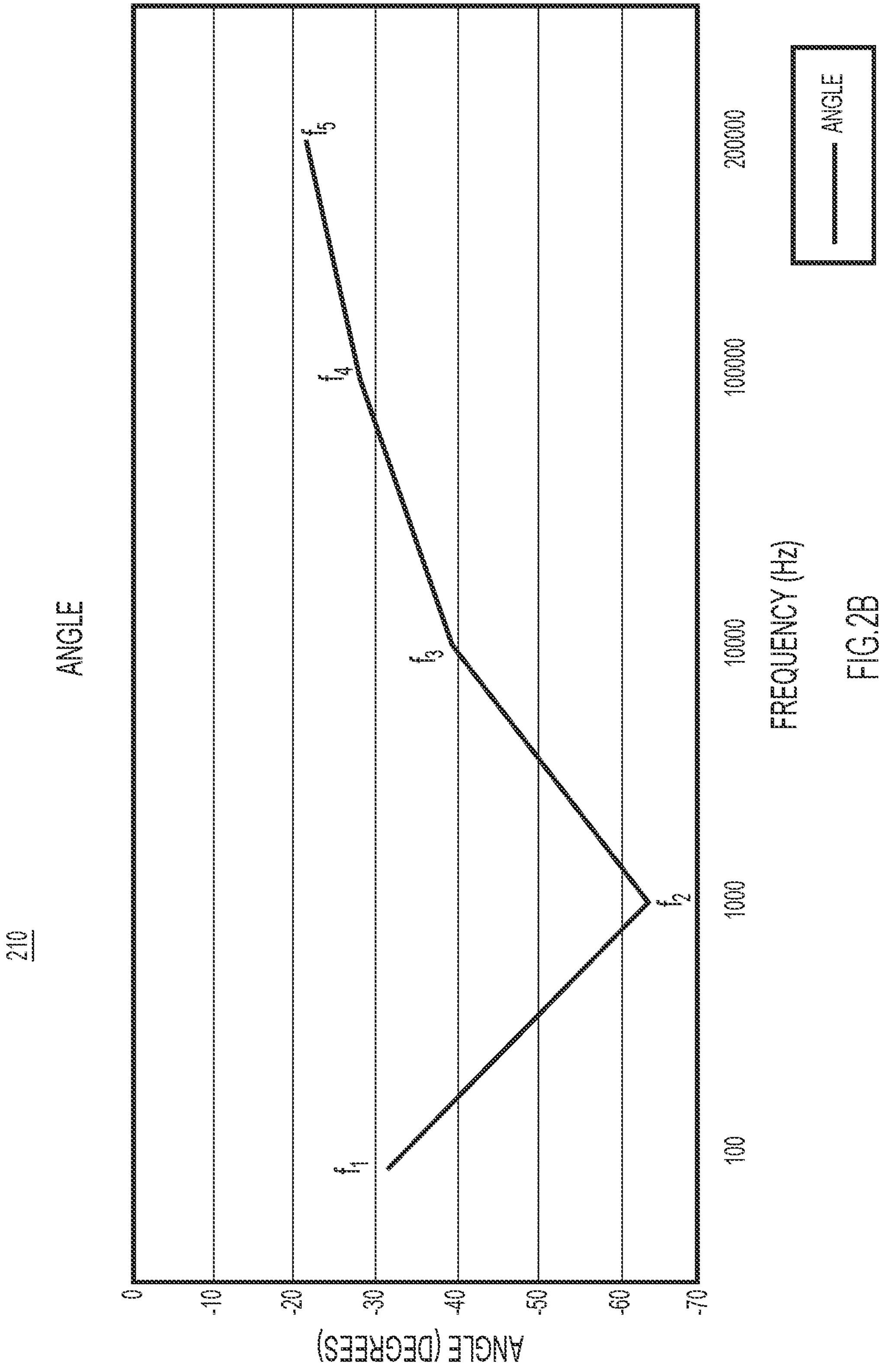
FIG. 2B is a plot of angle versus frequency for human body impedance.

The digital fuse 140 and digital fuse 150 shown in FIG. 1 are configured to operate using impedance for detecting a fault on a wire. For example, human body impedance can be modeled as a resistor and capacitor in parallel. FIG. 2A shows a plot 200 of magnitude versus frequency for body impedance and FIG. 2B shows a plot 210 of angle (phase) versus frequency. The plots of FIGS. 2A and 2B are derived from experiments. The body impedance on a conductive wire can be modeled as Z=R+jXm, where Xm is mostly capacitive and can be positive or negative, dependent on frequency.

Figure 3A:
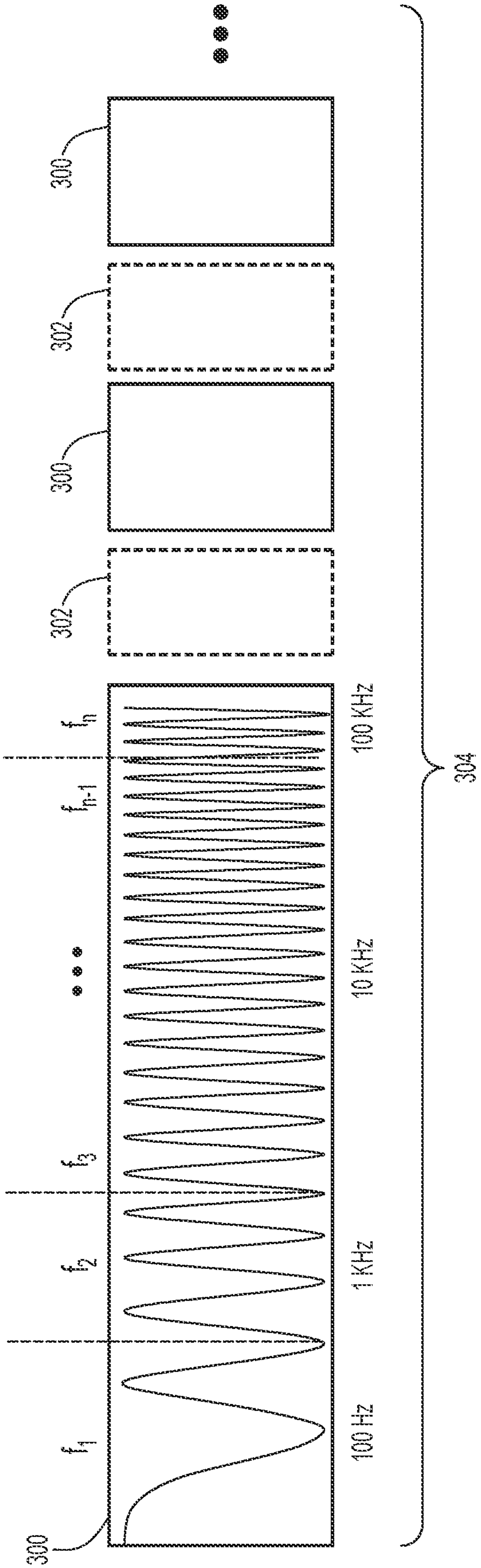
FIG. 3A illustrates a chirp pulse that is generated and applied to a wire carrying power in a power delivery system to enable impedance-based fault detection, according to example embodiment.
Figure 3B:
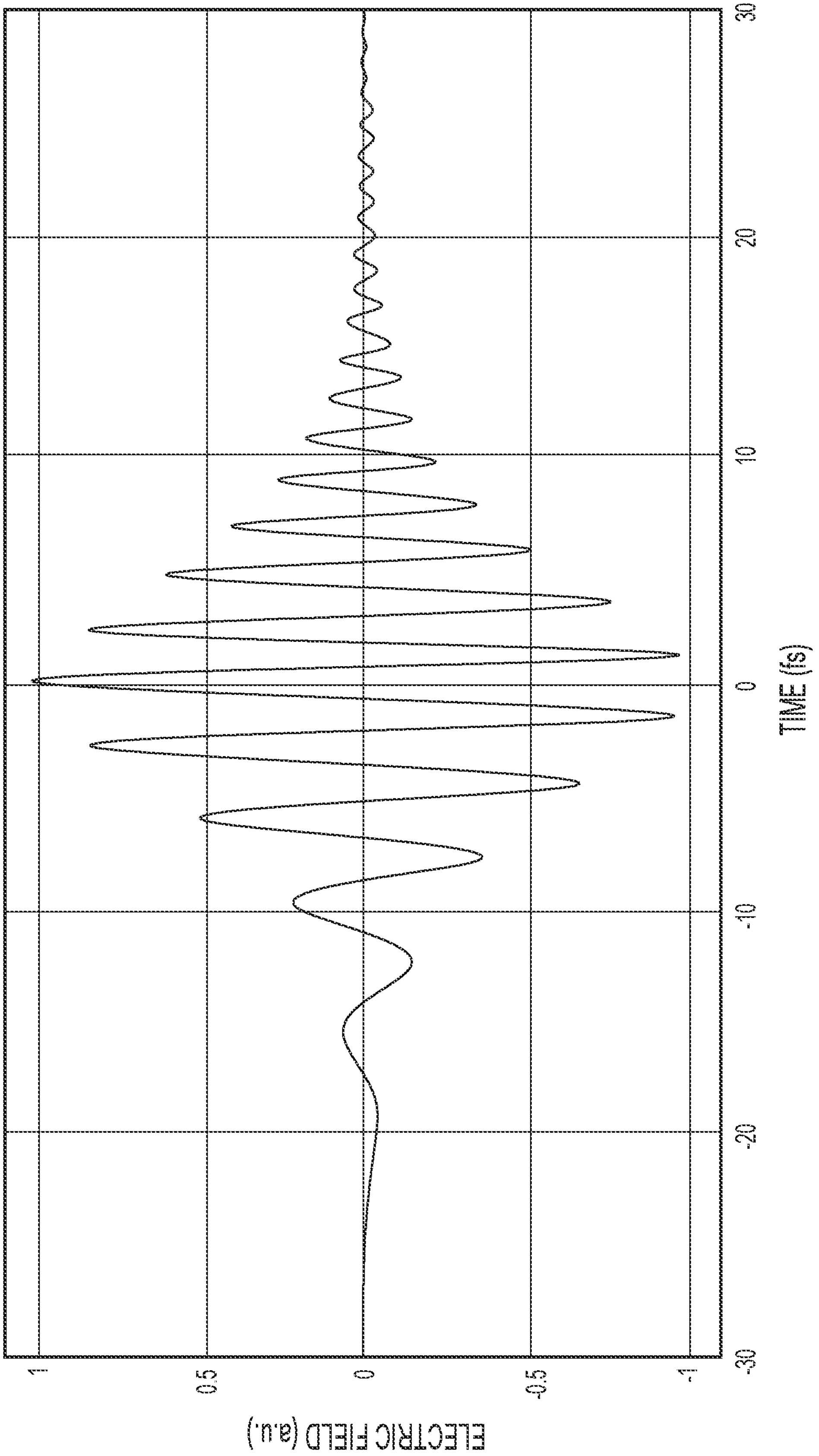
FIG. 3B illustrates another type of chirp pulse that may be applied to a wire carrying power in a power delivery system to enable impedance-based fault detection, according to an example embodiment.

Based on the experimentation results depicted by FIGS. 2A and 2B, it has been discovered that a fault can be detected on a wire by injecting chirp pulses onto the wire, where each chirp comprises a sequence of waveforms at a plurality of frequencies [$f_1$, $f_2$, . . . , $f_n$] offset from each other in time and then observing the received (returned/reflected) signal on the wire at the plurality of frequencies with respect to a body impedance curve. In one example, each chirp pulse comprises a sequence of a plurality of sine waveforms of different frequencies, each waveform lasting for a predetermined time interval of the chirp pulse. FIG. 3A illustrates an example of a chirp pulse 300 that is comprised of a sequence of frequencies $f_1$, $f_2$, $f_3$, . . . , $f_n$ that may continuously repeat for each chirp pulse. In some embodiments, there may be a quiet period 302 between successive chirp pulses 300. This may be useful to enable detection of faults. The quiet period 302 can be considered part of a repeating chirp sequence 304 that includes chirp pulses 300 separated by quiet periods 302. In any case, each chirp pulse comprises a sequence of frequencies $f_1$-$f_n$. FIG. 3B illustrates an example of a chirp pulse 310 that combines multiple frequencies. Chirp pulse 310 is suitable, but is more complex and expensive to generate and analyze returned/reflected signals than the chirp pulse 300 shown in FIG. 3A. Fast Fourier Transform (FFT) analysis could be performed on a continuous basis across a broad frequency spectrum for chirp pulse 310 (and chirp pulse 300 for that matter), though FFT analysis tends to be more expensive in terms of hardware capabilities. Nevertheless, FFT analysis is one tool that may be used in accordance with the techniques presented herein. Whether or not FFT analysis is performed may depend on the number of frequency samples being taken and the computational resources used.

Figure 3C:
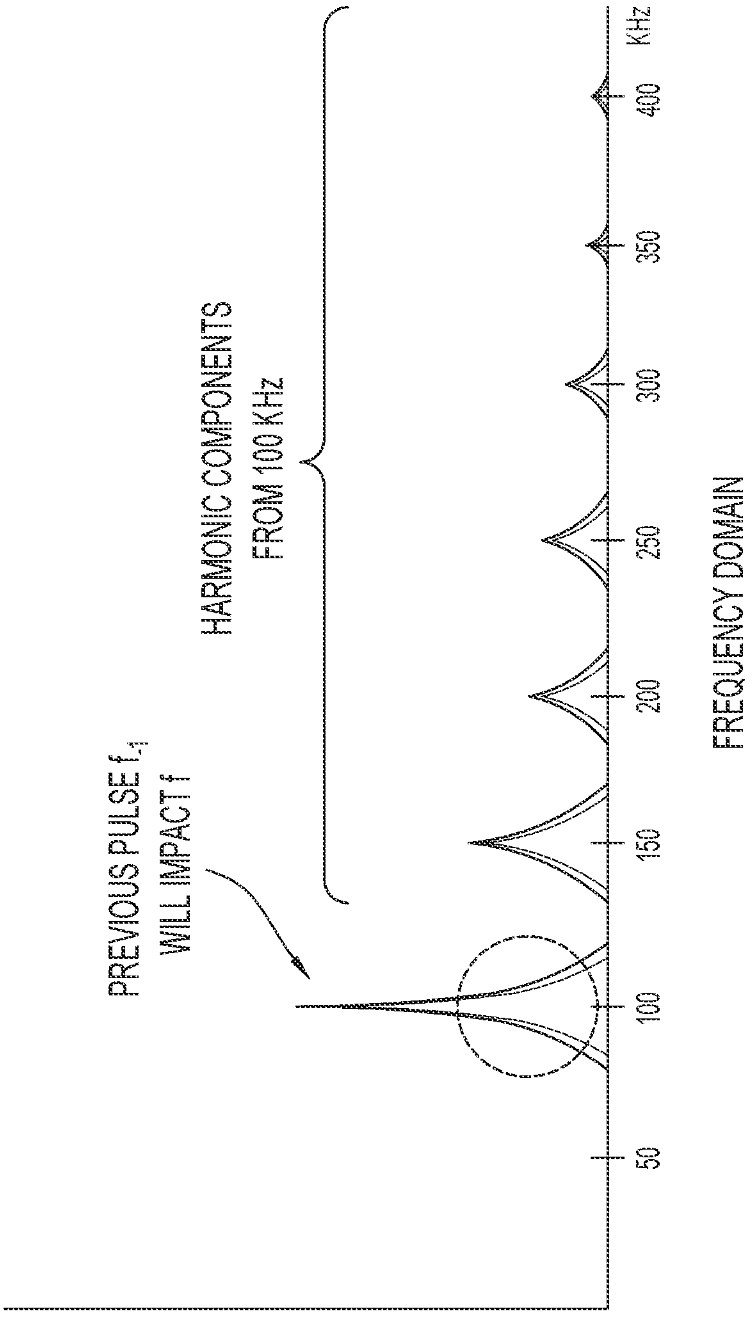
FIG. 3C is a diagram illustrating the impact of harmonics from a lower frequency waveform of a chirp pulse on subsequent higher frequency waveforms of the same pulse.

While the sequence of waveforms at a plurality of frequencies of a chirp is shown as a sequence of sinewaves, this is not meant to be limiting. The chirp pulse can consist of other waveform types (square waves, triangular waves, pseudonoise, etc.) and may include more or fewer frequencies. When sending a pulse sequence that starts with a lower frequency waveform first and continues to a highest frequency waveform last in the sequence, the harmonics from the previous lower frequency waveform may impact the digital filter detection and sensitivity. This is shown by the plot 315 of FIG. 3C for an example of the impact of harmonics from a 100 kHz waveform on subsequent higher frequency waveforms, e.g., 150 kHz, 200 kHz, etc.

Figure 3D:
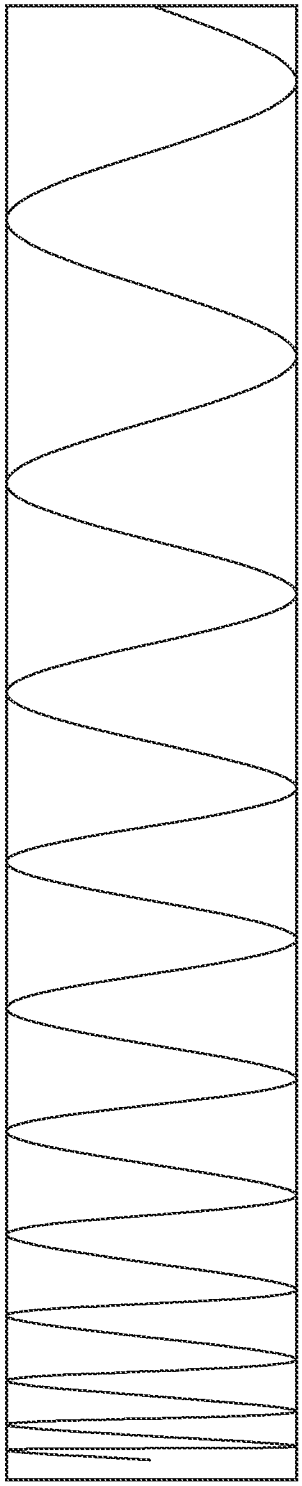
FIG. 3D illustrates a chirp pulse with the frequencies arranged in an order from highest frequency to lowest frequency, according to an example embodiment.
Figure 3E:
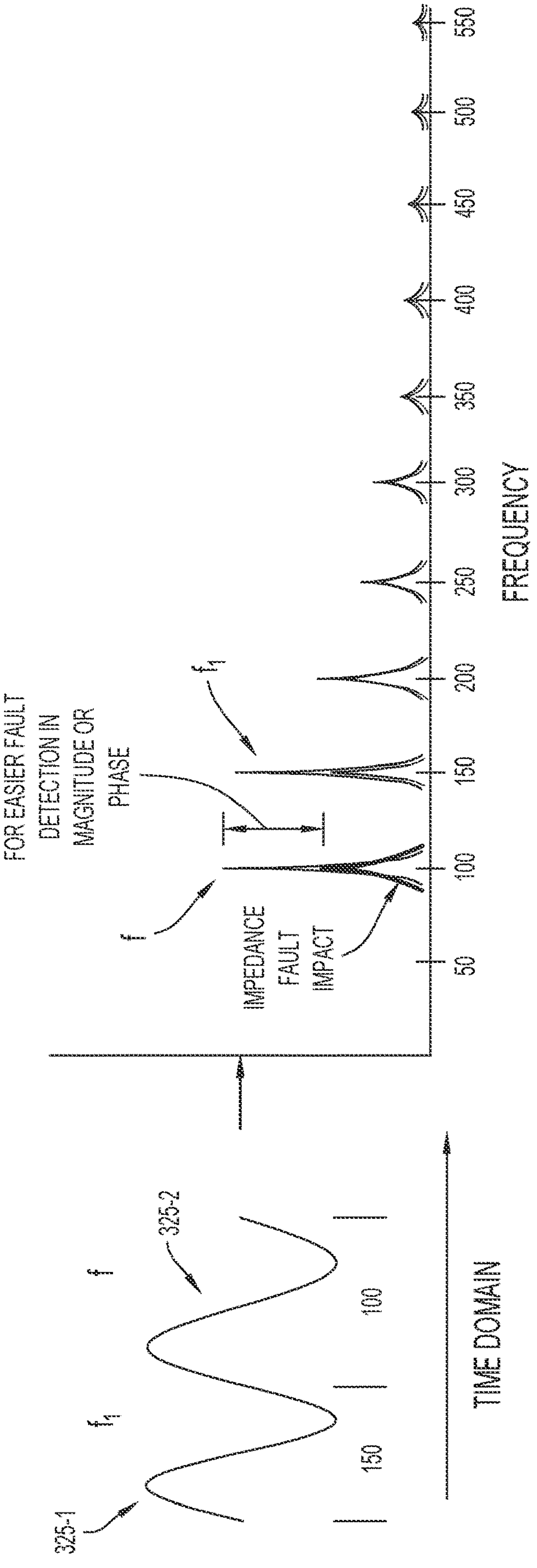
FIG. 3E is a diagram illustrating the advantages of dissipated harmonics from a higher frequency waveform on subsequent lower frequency waveforms in a chirp pulse, such as the chirp pulse shown in FIG. 3D, according to an example embodiment.

The order of the frequencies can be other than ascending; it could be descending, alternating, random etc. There may be advantages to a descending frequency order, including reducing harmonics to thereby improve filter performance of the signal obtained from the wire for analysis, as well as reducing the compute time needed to be performed for analysis of the signal. To this end, reference is now made to FIG. 3D, which shows a chirp pulse 320 comprising a sequence of waveforms having frequencies arranged in descending order from highest frequency first to lowest frequency last. The chirp pulse 320 may be part of a chirp pulse sequence such as that shown in FIG. 3A (where successive chirp pulses may be separated by quiet periods). Using the descending order of waveform frequencies in chirp pulse 320, the impact of harmonics can be significantly reduced, allowing for a broader range of impedance detection. This advantage is illustrated in FIG. 3E for consecutive waveforms of 150 kHz shown at 325-1 followed, in time, by a 100 kHz waveform shown at 325-2, as an example. The harmonics for the 150 kHz waveform (referred to as $f_{-1}$) will already have dissipated and will not impact the next waveform in the chirp pulse, the 100 kHz waveform (referred to as $f_1$). This makes it easier for fault detection based on magnitude or phase at 100 kHz.

In one embodiment, the signal obtained from the wire (after application of the chirp pulse or while the chirp pulse is applied) may be run through a set of digital bandpass filters as indicated above, where each filter in the set corresponds to the sequence of frequencies $f_1, f_2, f_3, \ldots, f_n$. Digital bandpass filters are quite inexpensive to implement. The digital filters are independent of each other and may be configured to detect a magnitude and/or phase of an impedance. When the impedance of the wire changes due to a fault, e.g., when a body (human body) touches a wire carrying power, there is a reflection back to the source of the chirp pulse on the send wire. In addition, the impedance fault on the wire, e.g., when a human body touches the wire carrying power, causes high frequency loss characteristics on the signal on the return wire signal. In other words, for a chirp pulse applied to the send wire, body impedance on the wire adds to loss seen between the send wire and return wire, as well as produces reflections on the send wire. The digital fuse analyzes these signals at the frequencies of the chirp pulses to detect an impedance-based fault. It is possible that one digital filter with multiple all-pass frequency summing may be used to detect an impedance fault. In the case where the chirp pulses are composed of pseudonoise (e.g., broadband waveforms), a set of matched filters (similar to correlators) may be used in place of bandpass filters.

Thus, the impedance-based fault detection techniques presented herein involve analyzing the frequencies of waveforms contained in signals on the wire(s), comparing the impedance at each frequency to a reference impedance, and then shutting off power at the power transmitter (and/or initiating a restart) if any or several frequencies are indicative of an impedance-based fault. While the above description is in terms of frequencies and frequency analysis, which would be used with sinusoidal components, any filter matched to the waveform components of the chirp signal may be used. As described in more detail below, the measured value at the output of each of the filters is compared to values associated with an impedance curve. Each filter, when its output is indicative of an impedance, can detect and trip a fault detection.

Figure 4A:
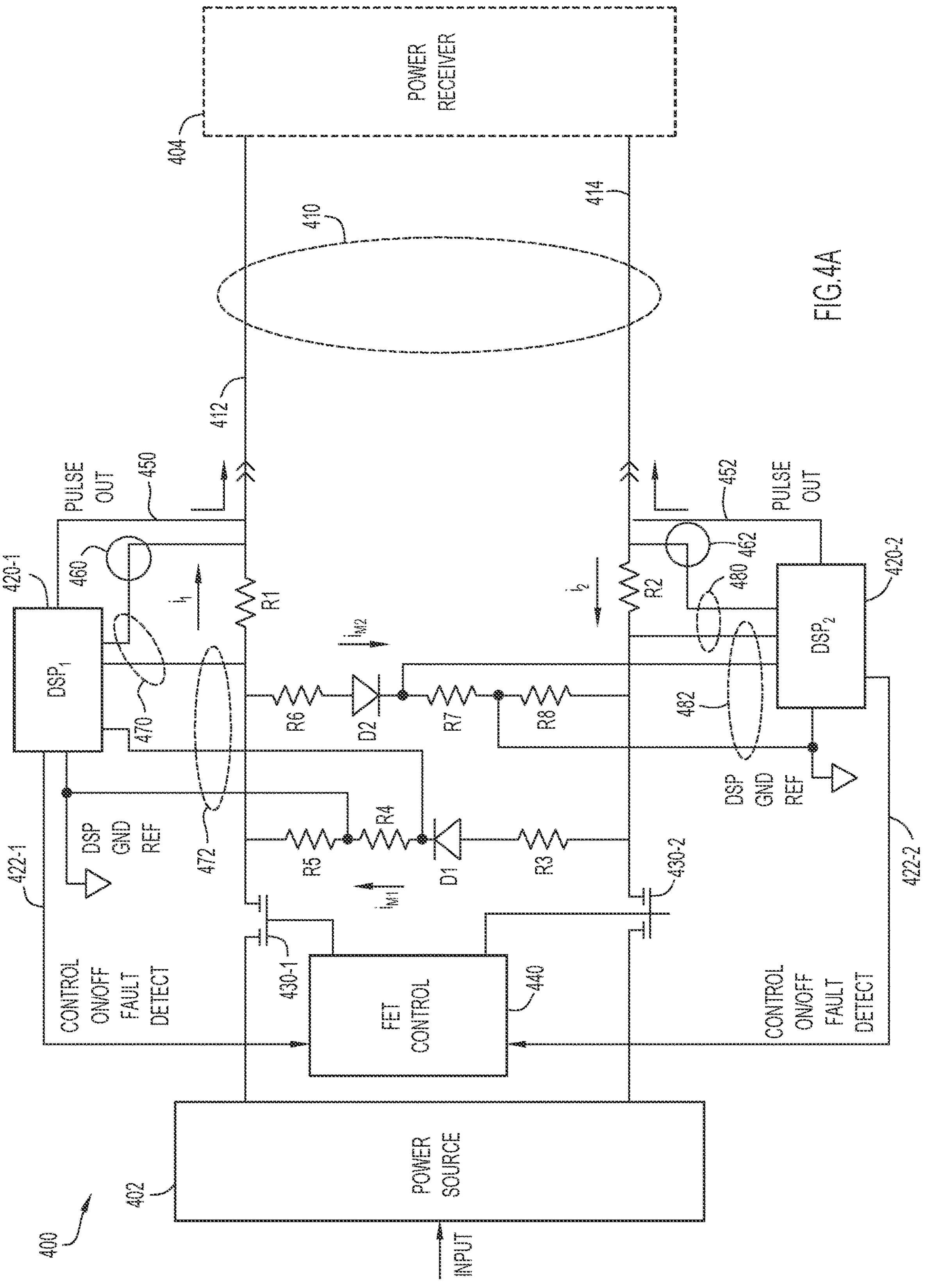
FIG. 4A is a schematic diagram of circuitry of the digital fuse shown in FIG. 1, according to an example embodiment.

Reference is now made to FIG. 4A, which shows a schematic diagram of a digital fuse 400 associated with a power transmitter, i.e., digital fuse 140 depicted in FIG. 1. The digital fuse 150 has a similar arrangement as that shown in FIG. 4A, but associated with a power receiver 404 (powered device). The digital fuse 400 is configured to connect between a power source 402 and wires of cable 410, and in particular to the send wire 412 and to the return wire 414. The digital fuse 400 includes first and second digital signal processors (DSPs) 420-1 and 420-2. DSP 420-1 is coupled to the send wire 412 and DSP 420-2 is coupled to the return wire 414. It should be understood that a single DSP (with appropriate isolation circuitry) could be used to handle signals to/from the send wire 412 and the return wire 414 instead of two DSPs as shown in FIG. 4A. The digital fuse 400 further includes field effect transistor (FET) switches 430-1 and 430-2 and a FET control circuit 440. The FET control circuit 440 receives as input a control output 422-1 from DSP 420-1 and a control output 422-2 from DSP 420-2. The switch 430-1 is connected between the power source 402 and the send wire 412 and the switch 430-2 is connected between the power source 402 and the return wire 414. The send current is shown as $i_1$ through resistor R1 on the send wire 412. The return current is shown as $i_2$ through resistor R2 on the return wire 414.

DSP 420-1 is configured to continuously inject chirp pulses onto the send wire 412 as shown at reference numeral 450. The chirp pulses from DSP 420-1 travel down the send wire 412 to the power receiver and come back on the return wire 414 through resistor R2 and through resistor R3 and diode D1 as current $i_{M1}$ and then splits at resistors R4 and R5. Likewise, DSP 420-2 is configured to continuously inject chirp pulses onto the return wire 414 as shown at reference numeral 452. The chirp pulses from DSP 420-2 travel down the return wire 414 to the power receiver and come back on the send wire 412 through resistor R1 and through resistor R6 and diode D2 as current $i_{M2}$ and then splits at resistors R7 and R8.

DSP 420-1 measures the signal on the send wire 412, via connection 460, resulting from the chirp pulses that it sends out. Similarly, DSP 420-2 measures the signal on the return wire 414, via connection 462, resulting from the chirp pulses that it sends out. In addition, the DSP 420-1 measures current on the connections as shown at 470 and measures voltage on the connections shown at 472. Likewise, the DSP 420-2 measures current on the connections as shown at 480 and measures voltage on the connections shown at 482.

Figure 4B:
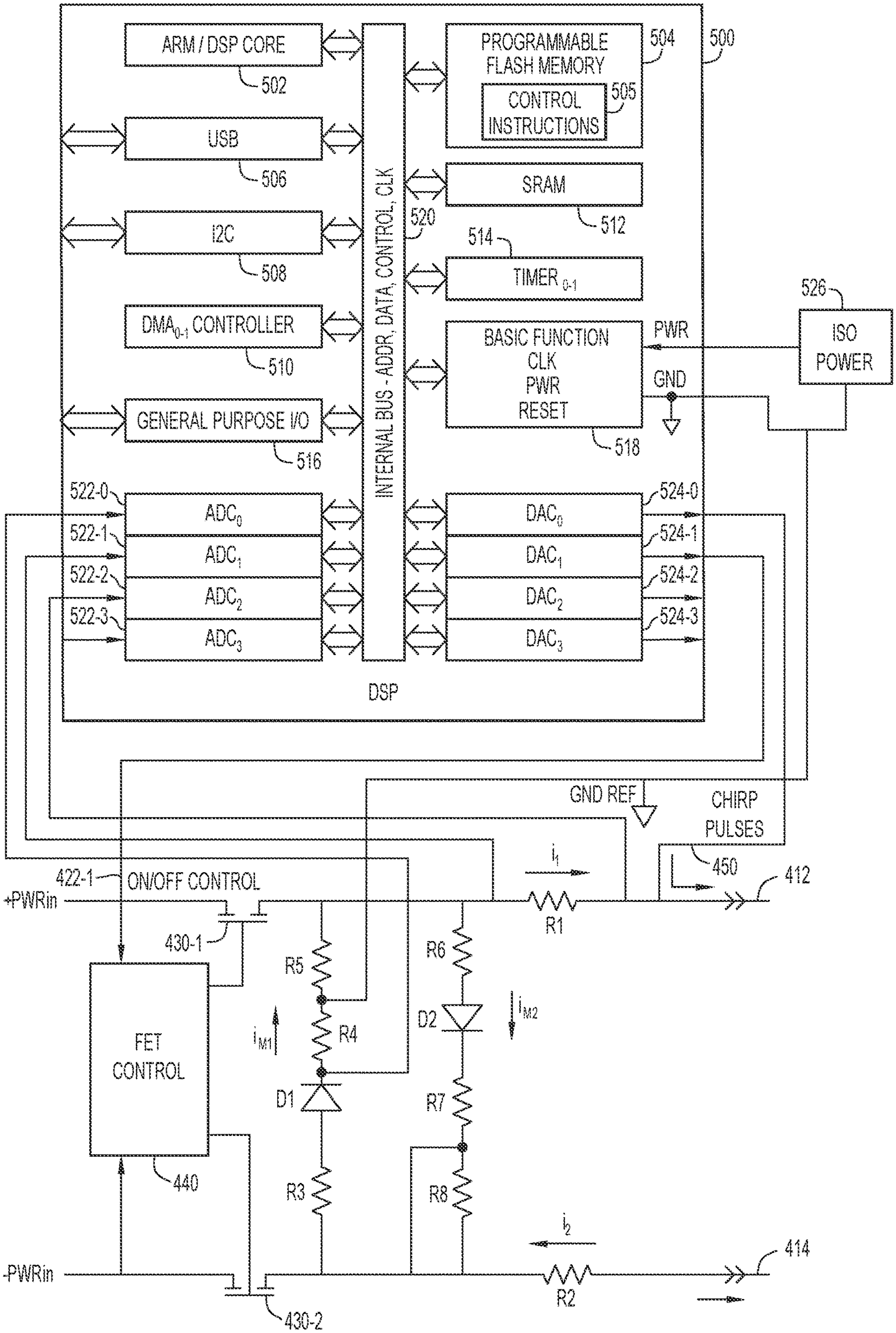
FIG. 4B is a block diagram of a digital signal processor and showing connections between the digital signal processor and the circuitry of the digital fuse, according to an example embodiment.

FIG. 4B illustrates an example block diagram of a DSP 500 and its connections to the circuitry in a digital fuse. The DSP 500 may be used for either or both of DSP 420-1 and 420-2 shown in FIG. 4A. In one non-limiting example, the DSP 500 may be based on an ARM core processor, such as a signal processor manufactured by ST Microelectronics, e.g., STM32F336xC/E. "ARM" is formerly an acronym for Advanced Reduced Instruction Set Computer (RISC) Machines and originally Acorn RISC Machine) and is a family of RISC instruction set architectures (ISAs) for computer processors. The DSP 500 includes an ARM/DSP core processor 502, programmable flash memory 504 that stores control instructions 505 (firmware) that are executed by the core processor 502 to perform the various operations described herein, a Universal Serial Bus (USB) 506, an I2C serial bus 508, a direct memory access (DMA) controller 510, synchronous random access memory (SRAM) 512, timer 514, general purpose input/output (I/O) 516, a basic functions block 518 (for clock (clk), power, and reset), and an internal bus 520 for address, data, control and clock. The DSP 500 further includes a block of analog-to-digital converters (ADCs) and a block of digital-to-analog converters (DACs). The number of ADCs and DACs may vary depending on the particular DSP. In one example, the DSP 500 includes four ADCs 522-0, 522-1, 522-2 and 522-3 and four DACs 524-0, 524-1, 524-2 and 524-3. The ADCs 522-0 to 522-3 receive input signals from the digital fuse circuitry and the DACs 524-0 to 524-3 are used to provide output signals to the digital fuse circuitry. Power is provided to the DSP via ISO power 526.

In at least one embodiment, processor 502 is at least one hardware processor configured to execute various tasks, operations and/or functions for DSP 500 as described herein according to software and/or instructions configured for DSP 500. Processor 502 (e.g., a hardware processor) can execute any type of instructions associated with data to achieve the operations detailed herein. In one example, processor 502 can transform an element or an article (e.g., data, information) from one state or thing to another state or thing.

In at least one embodiment, programmable flash memory 504 and SRAM 512 are configured to store data, information, software, and/or instructions associated with DSP 500, and/or logic configured for programmable flash memory 504 and SRAM 512. For example, any logic described herein can, in various embodiments, be stored for DSP 500 using any combination of programmable flash memory 504 and SRAM 512.

Internal bus 520 can be configured as an interface that enables one or more elements of DSP 500 to communicate in order to exchange information and/or data. Bus 520 can be implemented with any architecture designed for passing control, data, and/or information between processors, memory elements/storage, peripheral devices, and/or any other hardware and/or software components that may be configured for DSP 500. In at least one embodiment, bus 520 may be implemented as a fast kernel-hosted interconnect, potentially using shared memory between processes (e.g., logic), which can enable efficient communication paths between the processes.

In various embodiments, the DSP 500 may store data/information in any suitable volatile and/or non-volatile memory item (e.g., magnetic hard disk drive, solid state hard drive, semiconductor storage device, RAM, read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, DSP firmware instructions, software [potentially inclusive of object code and source code], etc.) for execution by one or more processor(s), and/or other similar machine, etc. Generally, programmable flash memory 504 and SRAM 512 can store data, software, code, instructions (e.g., processor instructions), logic, parameters, combinations thereof, and/or the like used for operations described herein. This includes programmable flash memory 504 and SRAM 512 being able to store data, software, code, instructions (e.g., processor instructions), logic, parameters, combinations thereof, or the like that are executed to carry out operations in accordance with teachings of the present disclosure.

The ARM/DSP core processor 502 performs the various signal processing functions for the DSP 500 associated with generating chirp pulses, analyzing signals obtained from the digital fuse circuitry and generating ON/OFF control to the digital fuse circuitry, as described herein. In one example, DAC 524-0 is used to output the chirp pulses generated by the DSP 500 onto wire 412 as shown at 450. DAC 524-1 is used to output the ON/OFF control output 422-1 to the FET control circuit 440. The inputs to the DSP 500 from the digital fuse circuitry include the signal (current) after resistor R1, that is provided as input to ADC 522-2. The current into resistor R1 is obtained and provided as input to ADC 522-1. Finally, the current at the input of diode D1 before resistor R4 is provided as input to ADC 522-1, and this current is used to measure impedance on the send wire 412 based on analysis at the frequencies of the chirp pulse. In addition to measuring currents, the DSP uses the signals obtained by ADC 522-0 and ADC 522-1 to measure voltage.

It is to be noted that FIG. 4B shows only one DSP associated with the send wire 412, e.g., DSP 420-1 of FIG. 4A. A similar DSP and connections would be provided for DSP 420-2 of FIG. 4A. However, it is also envisioned that one DSP, with suitable processing capabilities and a number of ADCs and DACs could be used in place of two separate DSPs.

Figure 5:
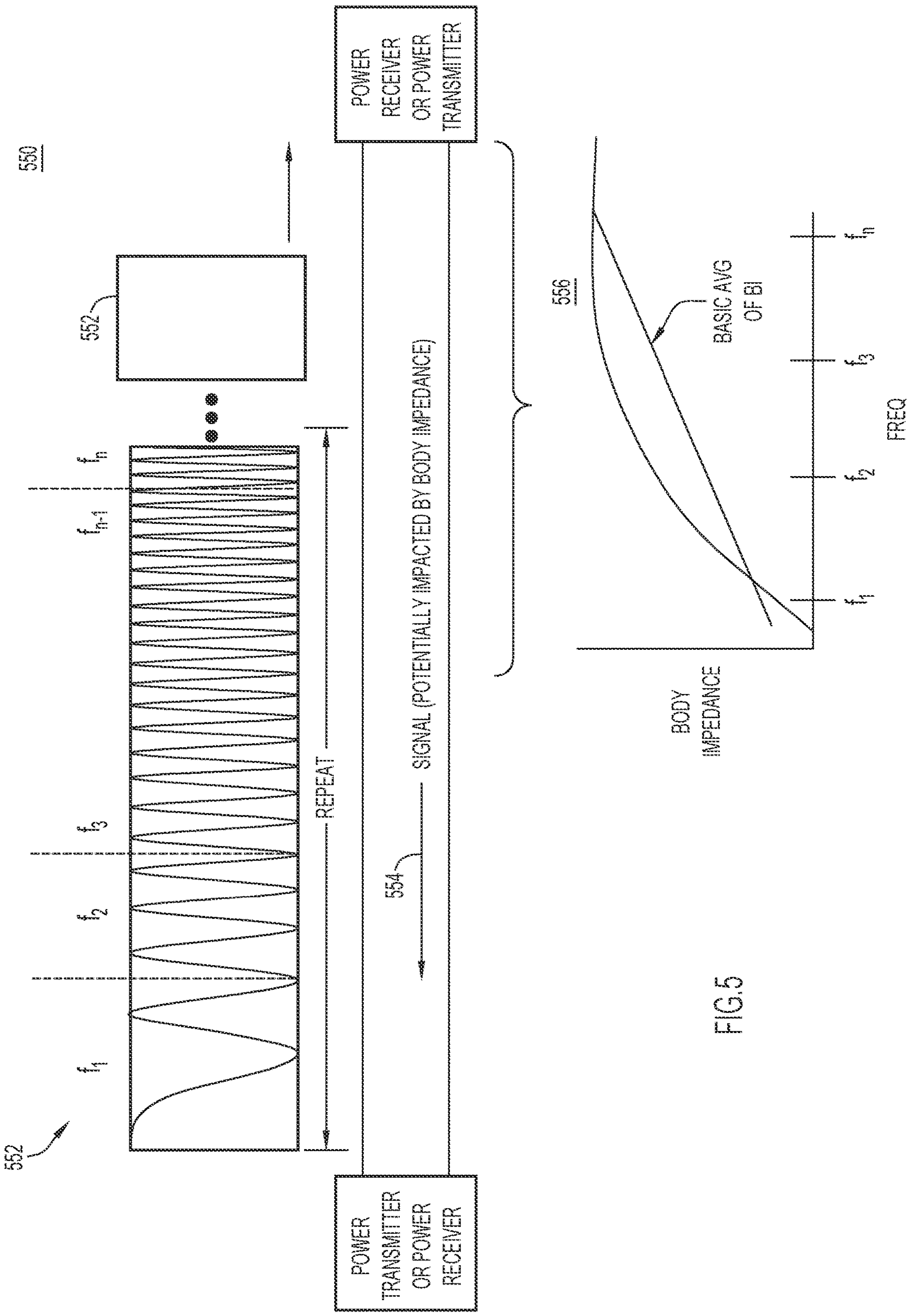
FIG. 5 is a diagram depicting the application of the chirp pulse on a wire in a power delivery system, according to an example embodiment.

FIG. 5 illustrates a paradigm 550 depicting operation of the digital fuse shown in FIGS. 4A and 4B, at either a power transmitter side or a power receiver side. One side, e.g., a power transmitter, sends a chirp pulse 552 to the other side. The frequencies of each of the chirp pulses 552 could be in decreasing order (from highest frequency to lowest frequency) as shown in FIG. 3D. As explained herein, in most applications, a series of chirp pulses 552 will be applied on a continuous/repeating basis. A signal 554 is received from the other side, e.g., a power receiver, and the signal 554 could potentially be impacted by an impedance, e.g., a body impedance of a human touching the line (with one or both hands). The plot 556 shown in FIG. 5 depicts how body impedance (versus frequency) may impact the signal on the line at the various frequencies of the chirp pulse. The digital fuse is configured to detect presence of this impact.

Figure 6:
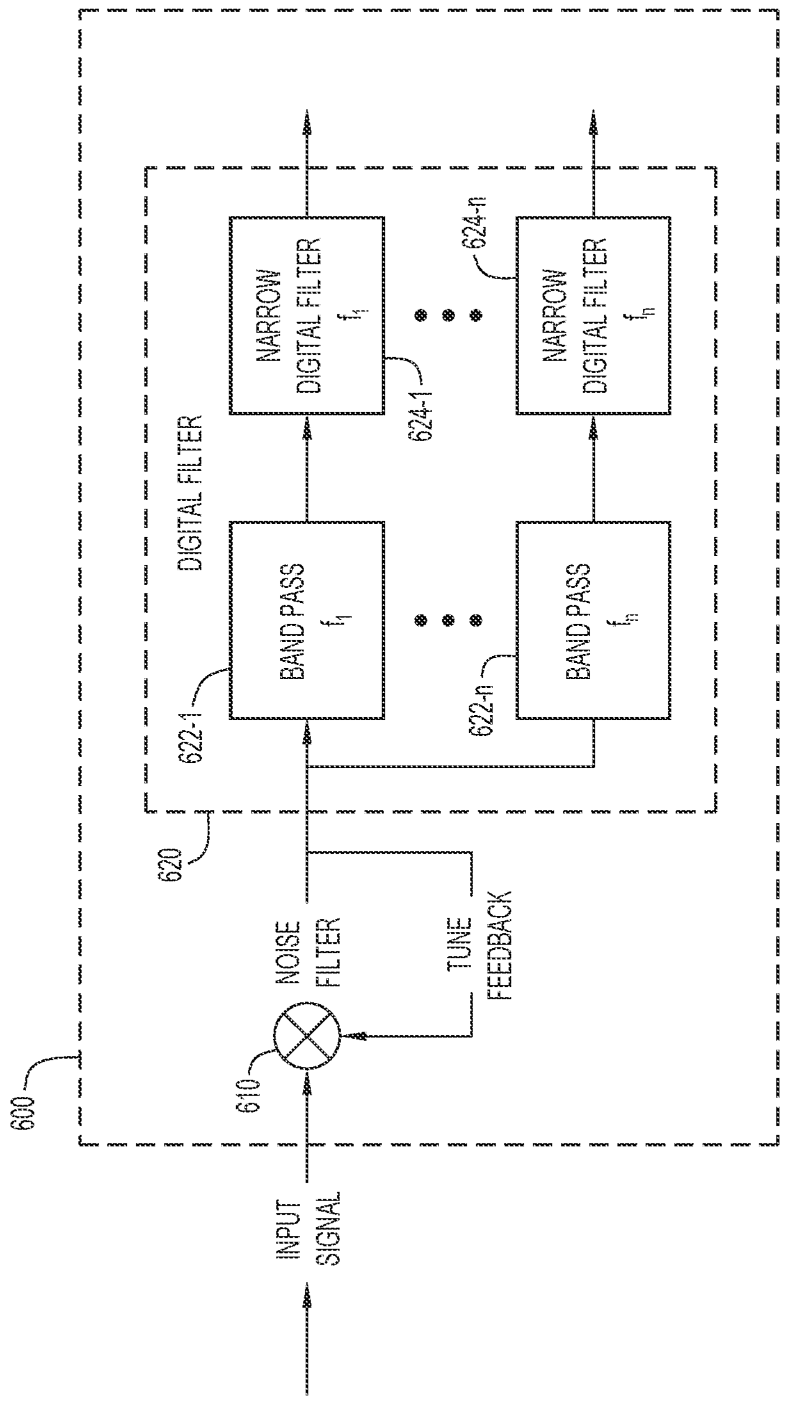
FIG. 6 is a diagram depicting the signal processing functions performed in a digital signal processor shown in FIGS. 4A and 4B, according to an example embodiment.

Turning now to FIG. 6, the processing of the signal obtained from a wire over which power and chirp pulses are applied, is now described. The core processor 600 of the DSP is programmed (with suitable firmware instructions) to execute a noise filter 610 and a digital filter 620. The digital filter 620 includes a set of digital bandpass filters 622-1 to **622-*n* for frequencies $f_1$-$f_n$ corresponding to the N frequencies of the chirp pulse, and a narrowband digital filter 624-1 to 624-*n*. Thus, the output of the digital filter 620** is a magnitude and angle (phase) at each frequency $f_1$-$f_n$ of the chirp pulse. Each relevant frequency of the signal obtained from the wire is separated out.

Figure 7:
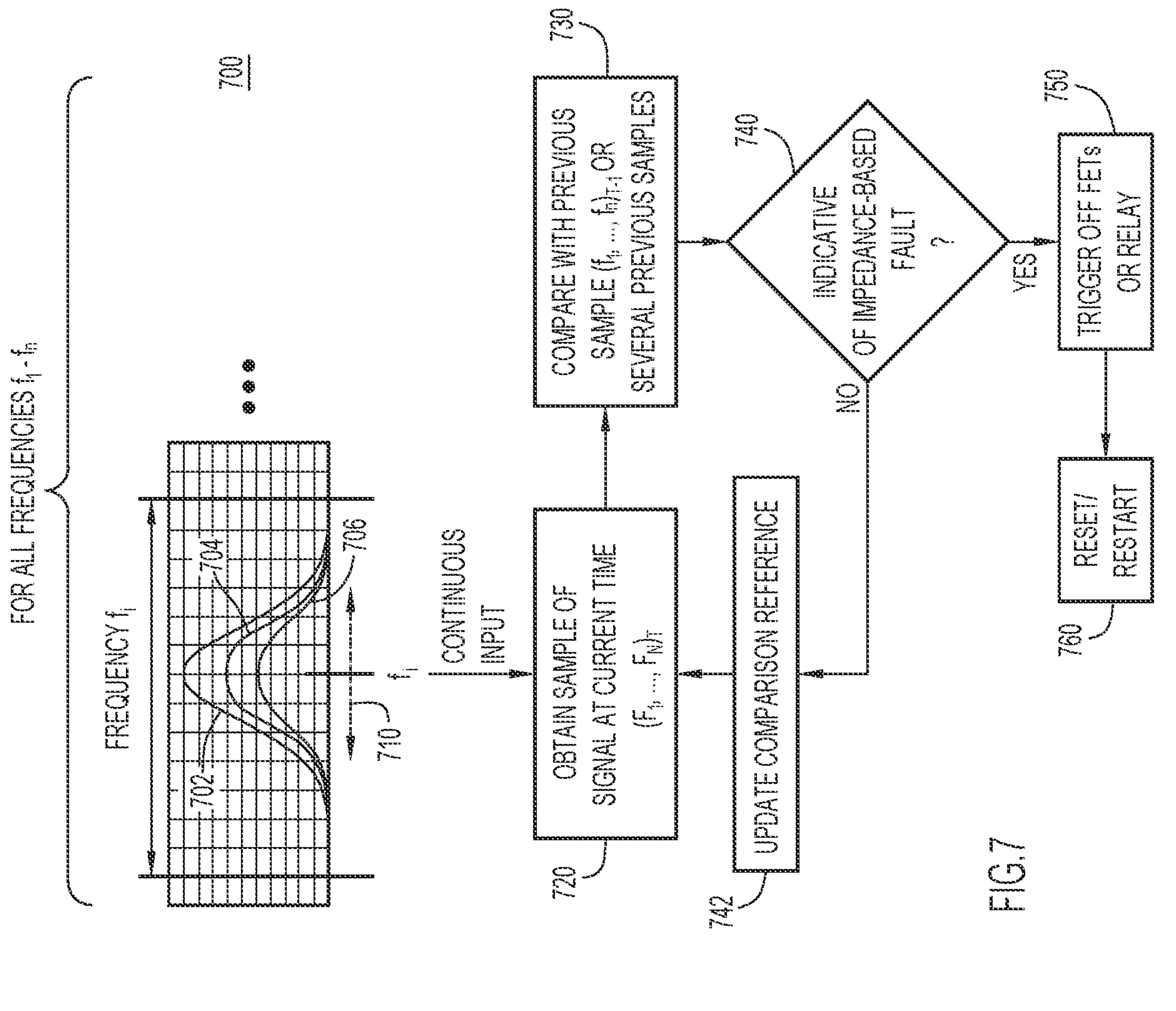
FIG. 7 is a flow diagram depicting the analysis performed on a returned signal from application of a chirp pulse to determine an indication of an impedance-based fault on a wire, according to an example embodiment.

Turning now to FIG. 7, a process flow 700 is shown that depicts the further processing of the output of the digital filter 620 of FIG. 6. The input signal contains frequency components corresponding to the frequency components of the chirp pulse that are impacted by an impedance (e.g., a body impedance if a human body is in contact across one of the wires of the cable). The body impedance model may be represented by the equation:

$$BI(x)=\Sigma_i^N \sin(i)(Ri+jXim,$$

where Xm is mostly capacitive in nature but does have an inductive component.

Each frequency is analyzed to look for an indication of impedance impact. Each frequency can have a different loss impact.

The process flow 700 includes frequency analysis logic that operates on the continuous input of the output of the digital filter 620. FIG. 7 shows, at a given frequency band around frequency $f_i$ of one of the plurality of frequencies of the chirp pulse, three plots versus time: a plot 702 of the originally sent chirp pulse, a plot 704 depicting the loss of the line/wire, and a plot 706 of the received signal as potentially impacted by an impedance-based fault. As shown in this example, the plot 706 of the received signal at frequency $f_i$ is much lower than the line loss plot, and thus is suggestive of attenuation that could be caused by body impedance. Moreover, the plot 706 could be impacted by body impedance to shift to the left or right (an angular shift caused by the component Xm referred to in the above equation for BI(x)), as shown at reference numeral 710.

In the process flow 700, at step 720, data representing the magnitude and angle of the signal (called cable impedance) obtained from the wire at each of the frequencies $f_i \ldots f_n$ for a current time instant/sample T is obtained. This data is referred to as $(f_1 \ldots f_n)_T$. At step 730, the impedance data for the current time instant is compared to the impedance data for the previous time instant or sample, referred to as $(f_1 \ldots f_n)_{T-1}$. More generally, at step 730, a plurality of previous samples (smoothed or averaged) are used for the comparison with the sample at the current time $(f_1 \ldots f_n)_T$. By comparing the sample data to data taken at previous times, the determination is more robust to variations in impedance, including variations in body impedance and contact conditions. The techniques presented herein can be used to detect a wide variety of time-variant faults, such as the application of a ground fault, or the formation of an arc fault. Because the techniques involve analyzing the frequency characteristics as well as the time characteristics, faults may be more reliably detected, and nuisance trips can be avoided.

At step 740, a determination is made whether the impedance data is indicative of an impedance-based fault on the wire depending on how the impedance data for the current sample, $(f_1 \ldots f_n)_T$, compares with reference impedance data that may be the impedance data for the previous sample, $(f_1 \ldots f_n)_{T-1}$, or with a smoothed/averaged version of a plurality of previous samples. If, at 740, the determination is made that the impedance data indicates an impedance-based fault on the wire, then the process flow goes to step 750 where the FETs (for DC power) or relay (for AC power) (at the transmitter or receiver) are switched off (de-activated), disconnecting power from the line, and then the power transmitter can enter a reset/restart mode at step 760. On the other hand, if it is determined at step 740 that the impedance data is not indicative of body impedance, then the process continues again at step 720 after the reference used in step 730 is updated at step 742. That is, based on the impedance data at time T, at step 742, the reference that is used in the comparison in step 730 may be updated using averaging or smoothing techniques (e.g., arithmetic mean, autoregressive moving average (ARMA) filtering, or other digital filtering techniques to reduce noise, now known or hereinafter developed) and learning may be performed continuously to determine how best to update the comparison reference used in step 730. As shown by the plots in FIG. 7, at a given frequency, there may be an indication of body impedance depending on its magnitude or phase shift (left or right) relative to the data for that frequency at a previous sample.

Evaluating the impedance data at multiple frequencies provides greater reliability in determining whether there is an impedance-based fault on the wire. Vibration or compression could cause an impedance change versus a previous time sample, but will most likely not be spread across multiple frequencies. It would be undesirable to falsely detect a fault when there is just movement on the cable wire. Thus, the impedance impact could be minimal at a particular frequency, but when most of the frequencies (two or more) have an impedance characteristic that is indicative of an impedance-based fault, this improves the confidence that a fault is detected. Tripping on just one frequency may leave open the possibility of false fault detections. In one example, it may be desirable to use an impedance-based fault indication on one frequency as a means to enter a heightened "alert" status to evaluate the data on other frequencies for one or more future samples to confirm that there is an impedance-based fault, and then immediately trip the FETs at step 750.

Figure 8:
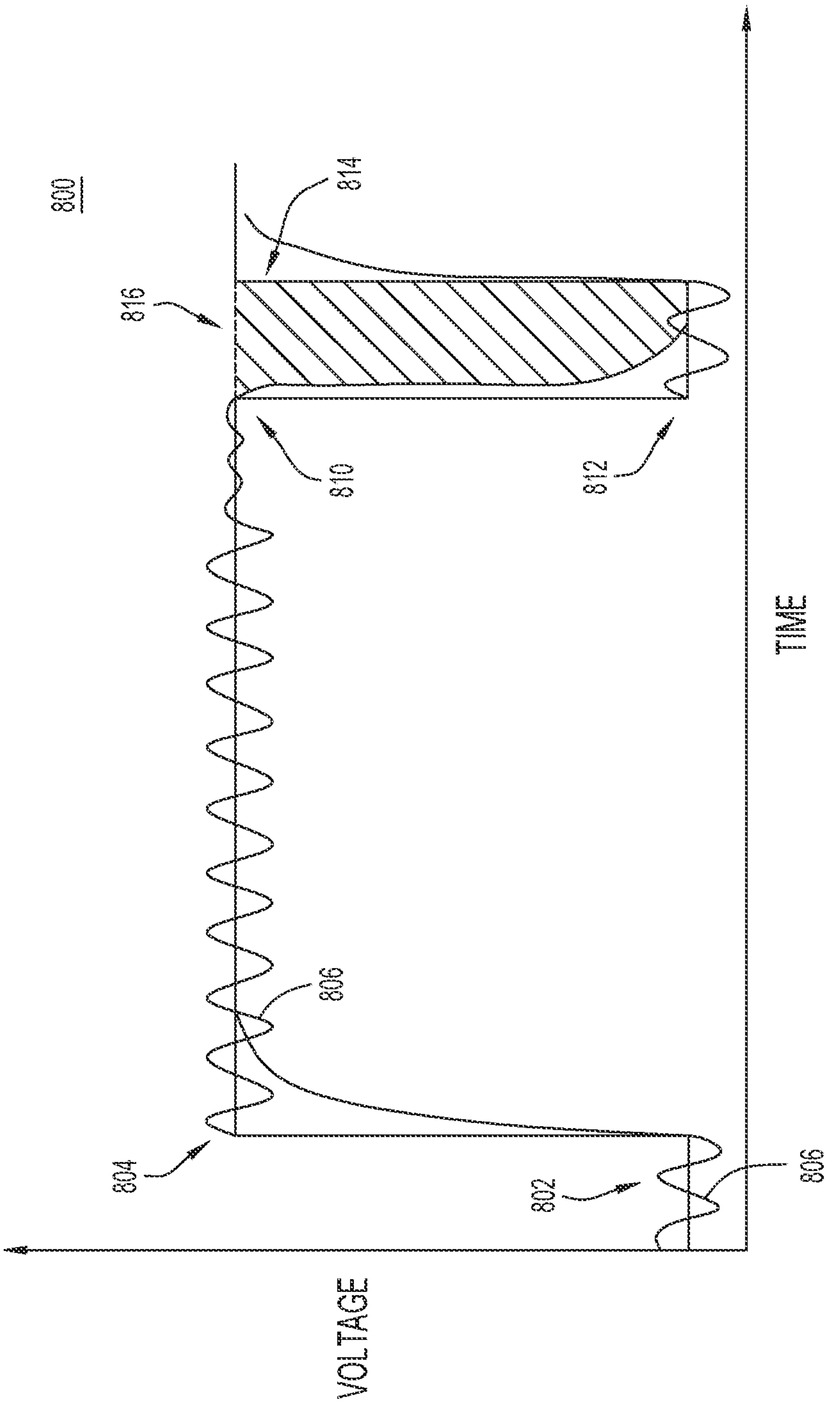
FIG. 8 is a diagram depicting the chirp pulses superimposed on power applied to a wire and termination of power on the wire when an impedance-based fault is detected, according to an example embodiment.

Reference is now made to FIG. 8, which shows a voltage waveform (e.g., DC voltage power) 800. At 802, a start-up mode is initiated at a low voltage, and then the power is increased to an operating voltage level (e.g., 380 VDC, 760 VDC, etc.) as shown at 804. Chirp pulses are continuously applied to the wire on top of the voltage waveform as shown at reference numeral 806. Each chirp pulse 806 (comprising a plurality of frequencies as shown in FIGS. 3A and 5) is represented by a full cycle (360 degrees) of a sine wave shown in FIG. 8. Voltage is continuously applied while chirp pulses 806 are repeatedly applied on the wire on top of the voltage. There is no need for pulsing power on and off and doing fault detection analysis between pulses. At some point in time, analysis of the reflected signal on the wire indicates an impedance-based fault and the voltage on the wire is shut off (e.g., via FETs) as shown at 810. At 812, the restart mode may be re-initiated and power may be turned back on to the full operating voltage level as shown at 814. Had no impedance-based fault been detected, then the voltage would have been kept on as shown at reference numeral 816.

The digital fuse solution presented herein can be realized with very inexpensive hardware (one or two DSPs), and moreover, allows for impedance-based fault detection with power continuously applied instead of pulsed on and off. For example, this solution can be deployed in a DSP chip that has as little as 8 kB of random access memory (RAM) and 32 kB of program memory, 12 inputs and 4 outputs.

Furthermore, this solution can be realized with multiple independent digital filters. Bandpass filtering may limit a range of frequency spanning a digital filter, each digital filter having the ability to flag a fault condition. The number N of frequencies in the chirp pulse may vary based on certain cost trade-offs and reliability trade-offs (greater SNR with more frequencies) and tuning that may be desired for certain power delivery applications.

The table below lists examples of digital filter frequencies (and associated chirp frequencies) that may be used, and the time it would take to detect an impedance-based fault at that frequency.

| Digital Filter Frequency | Fault Detection Time |
|---|---|
| 1 MHz | 1 μsec |
| 500 kHz | 2 μsec |
| 200 kHz | 5 μsec |
| 100 kHz | 10 μsec |
| 50 kHz | 20 μsec |
| 20 kHz | 50 μsec |
| 10 kHz | 100 μsec |
| 5 kHz | 200 μsec |
| 2 kHz | 500 μsec |
| 1 kHz | 1 msec |
| 500 Hz | 2 msec |
| 200 Hz | 5 msec |
| 100 Hz | 10 msec |

Since each of the filters is independent, the 200 kHz filter can make a decision in 5 μsec (since the last sample) and the 200 Hz filter can make a decision in 5 msec (since the last sample). The 100 Hz frequency is likely too low and not useful. The 500 kHz and 1 MHz frequencies may be too close to a frequency of power switches, and so may not be useful. A suitable range of frequencies would be 200 Hz, 500 Hz, 1 kHz, 2 kHz, 5 kHz, 10 kHz, 20 kHz, 50 kHz, 100 kHz and 200 kHz, several of which can make a detection in under 1 msec. Thus, the slowest detection would be 5 msec and the fastest detection may be 5 usec. By examining several frequencies (excluding 1 MHz, 500 kHz and 100 Hz), a decision that there is an impedance-based fault can be made in less than 1 msec or at least every 1 msec. That means a human would be exposed to power on the line for no more than 1 msec, which is so brief that the person would not even feel it before the power is shut-down, even at very high voltages (e.g., 760 VDC).

Figure 9A:
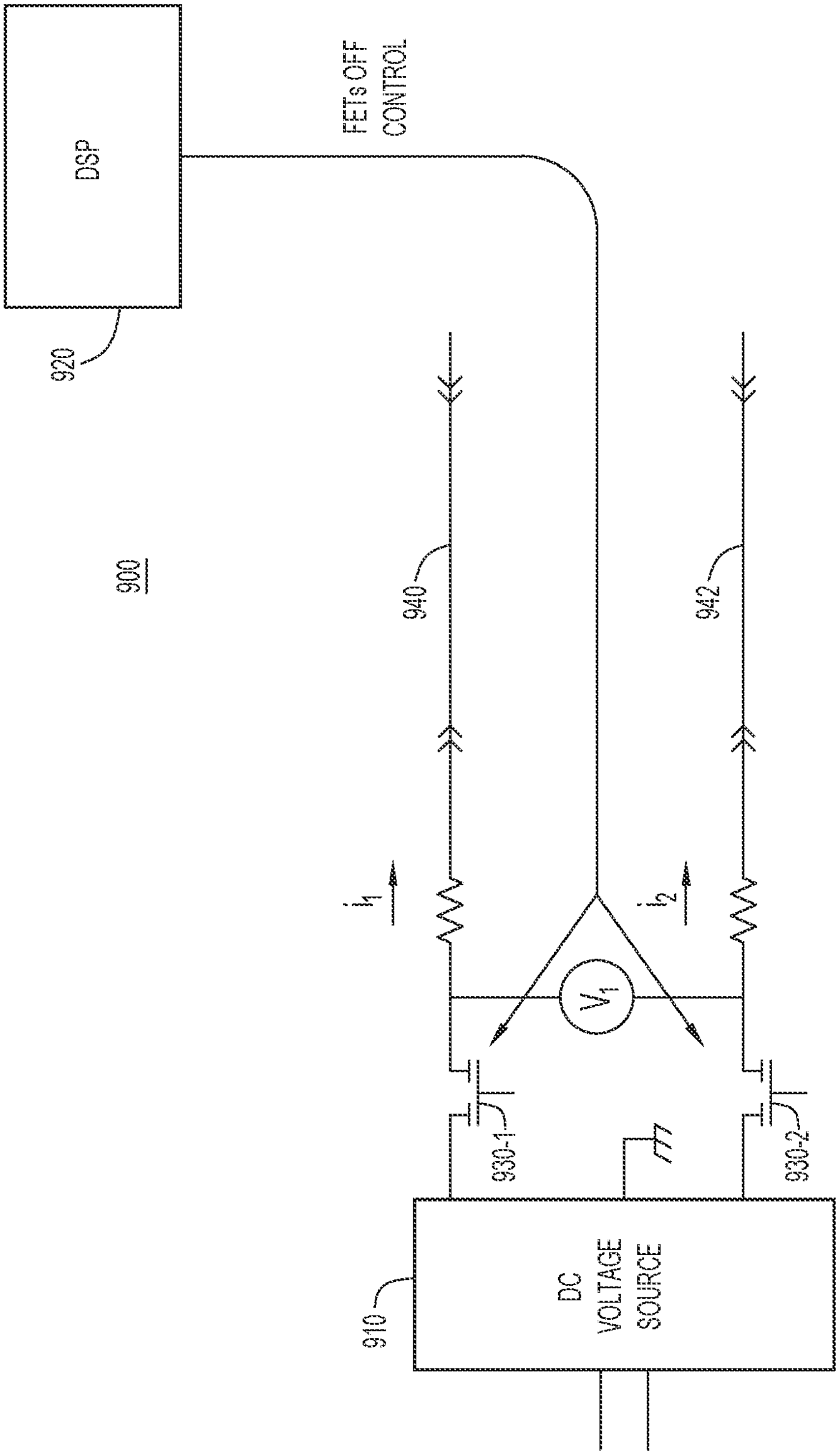
FIG. 9A is a block diagram depicting power shut-off circuitry for a DC voltage power delivery system, according to an example embodiment.

Turning now to FIG. 9A, a simple schematic diagram is shown of a DC power transmitter 900 having a DC voltage source 910, a DSP 920 that is included in a digital fuse (as described above in connection with FIGS. 4A and 4B) and FETs 930-1 and 930-2. The DSP 920 sends a FETs off control to the FETs 930-1 and 930-2 when the DSP 920 detects a fault. Thus, in the case of a DC power supply voltage, the FETs are de-energized to disconnect power to the send wire 940 and the return wire 942. There are other ways of turning the power "off" including terminating operation of an isolating converter that may be within, or preceding the DC voltage source 910, which isolating converter converts AC power to DC voltage.

Figure 9B:
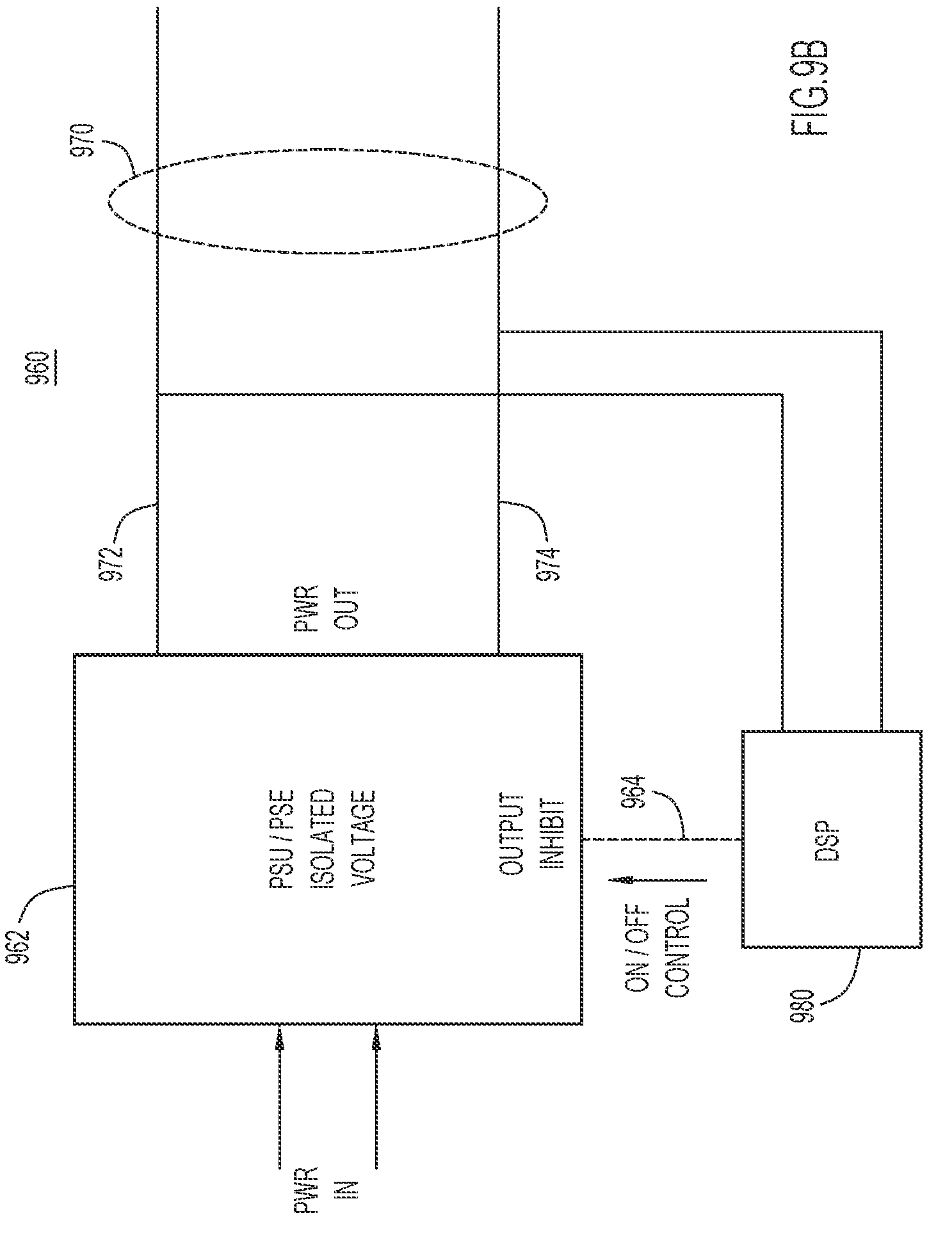
FIG. 9B is a block diagram depicting a variation of a power shut-off arrangement for a for a voltage power delivery system with power supply unit output inhibit control, according to an example embodiment.

FIG. 9B is a block diagram showing how power may be shut off at the transmit side (power source unit) 960 according to another embodiment. In this embodiment, the power source unit/power source equipment (PSU/PSE) 962 generates from an input power (PWR IN) an isolated voltage for output (PWR OUT) to a cable 970 that includes wires 972 and 974. A DSP 980 is coupled to the wires 972 and 974 and provides the ON/OFF control output (e.g., FETs ON/OFF) to an output inhibit control 964 on the PSU/PSE 962 to shut off power to the cable 970.

As explained above in connection with FIG. 1, the digital fuse may be deployed at both the transmit side and receive side of a power delivery system. Moreover, in some applications, it is sufficient that the digital fuse exists only at the transmit side.

Figure 10:
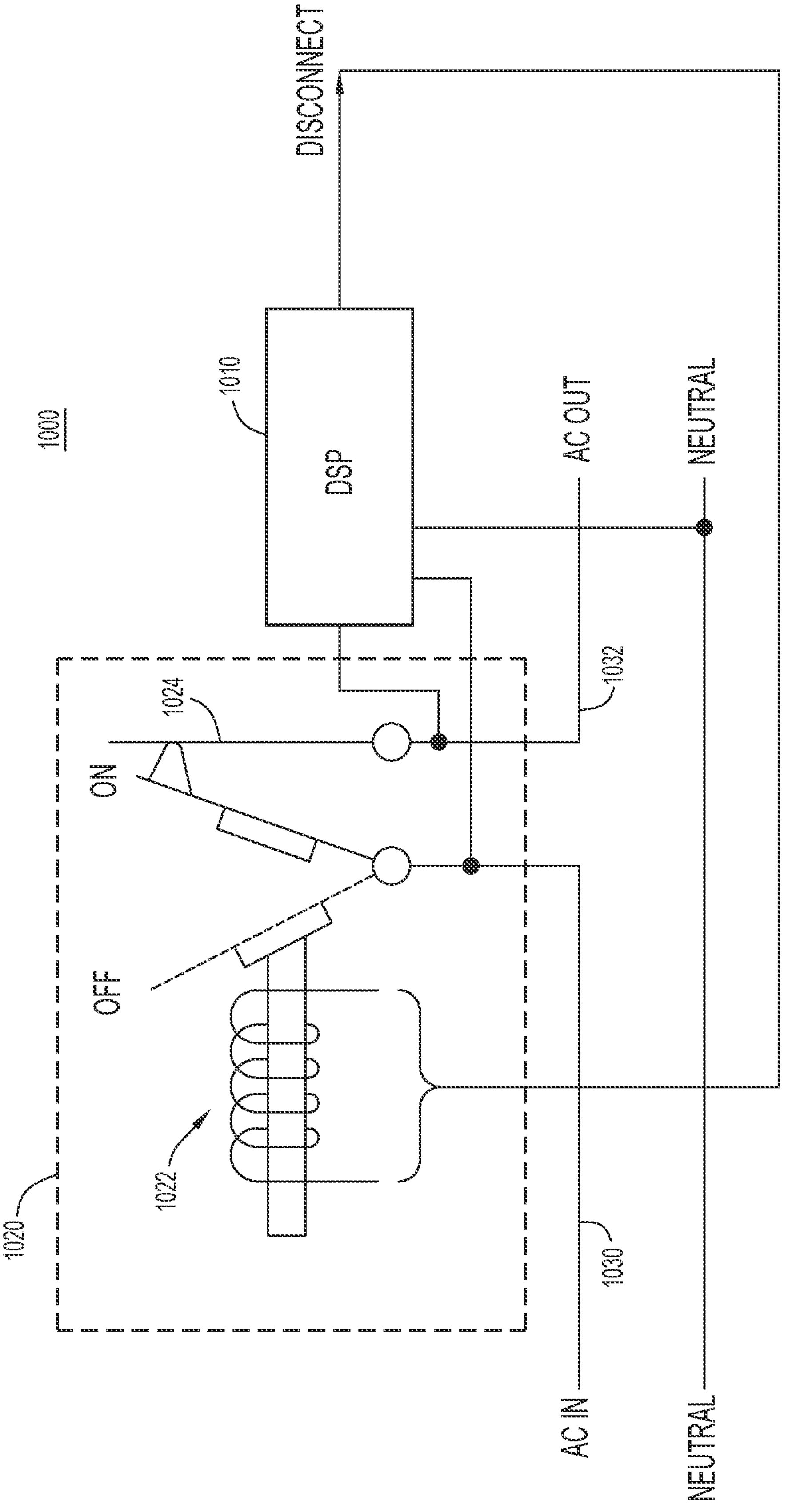
FIG. 10 is a block diagram depicting power shut-off circuitry for an AC voltage power delivery system, according to an example embodiment.

For AC power delivery, the "off" condition may be achieved in a manner different from that shown in FIG. 9A for DC power delivery. FIG. 10 shows part of an AC power transmitter 1000 that includes a DSP 1010 (that is included in a digital fuse as described above in connection with FIGS. 4A and 4B) and a relay arrangement 1020. In one example, the relay arrangement 1020 includes a single throw (one-way) relay 1022 that can connect/disconnect from contact 1024. The relay 1022 is connected to the AC IN line 1030 and the contact is connected to the AC OUT line 1032. FIG. 10 shows the relay 1022 in the closed (ON) position and the open (OFF) position in phantom. The DSP 1010 generates a disconnect control to cause the relay 1022 to switch to the OFF position when the DSP detects an impedance-based fault, thereby creating an open-circuit between the AC IN line 1030 and the AC out line 1032. The relay 1022 may need to be manually reset.

A solid state relay may be used instead of the analog single throw relay 1022. Further still, a triode for alternating current (triac) device may be used instead of a relay. A triac device is useful in AC applications as a three-terminal electronic device (back-to-back silicon current rectifiers) that can conduct current in either direction when triggered/controlled at its gate terminal. Other types of devices that may be used include an opto-isolator, which is an electronic circuit device that can transfer electrical signals between two isolated circuits using light. Moreover, it is envisioned that a FET switch solution may be suitable for some AC power applications. A switch, field effect transistor, relay, triac device and opto-isolator device are examples of a "disconnect or disconnect device" that may be used to maintain a connection to keep power flowing over a wire and then, in response to a control signal, open that connection to stop power from flowing over a wire, and thus make that wire safe to contact, e.g., by a human.

Figure 11:
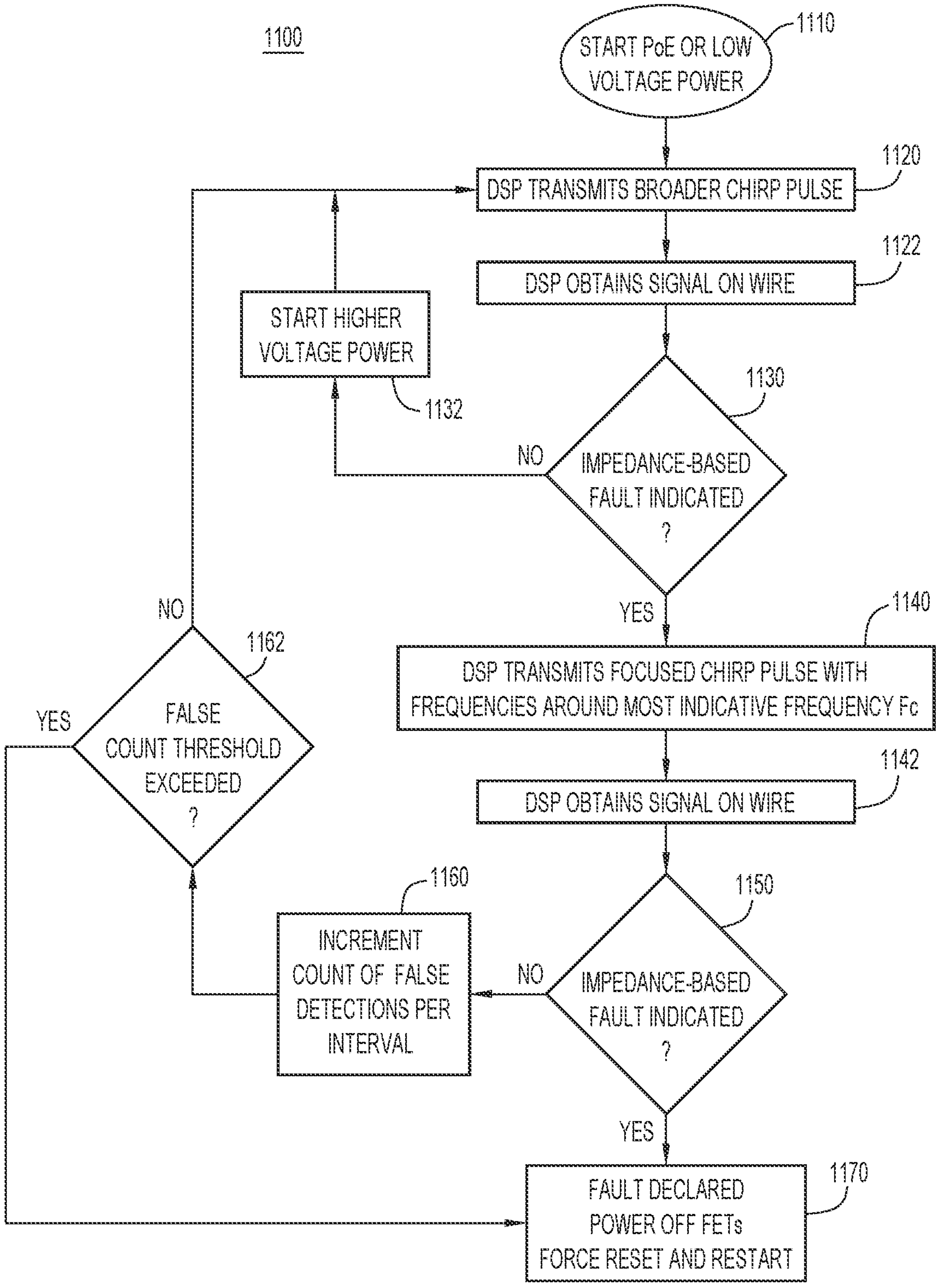
FIG. 11 is a flow chart depicting an impedance-based fault detection process that uses a first broad frequency chirp pulse and a second narrow frequency chirp pulse, according to an example embodiment.
Figure 12A:
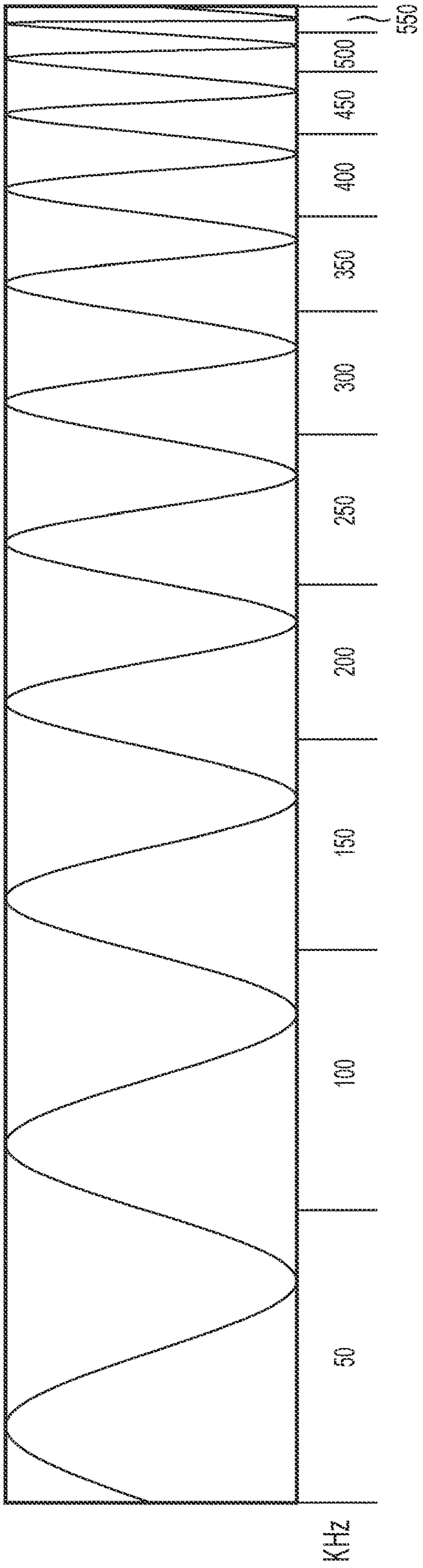
FIG. 12A is a diagram of the first broad frequency chirp pulse referred to in FIG. 11, according to an example embodiment.
Figure 12B:
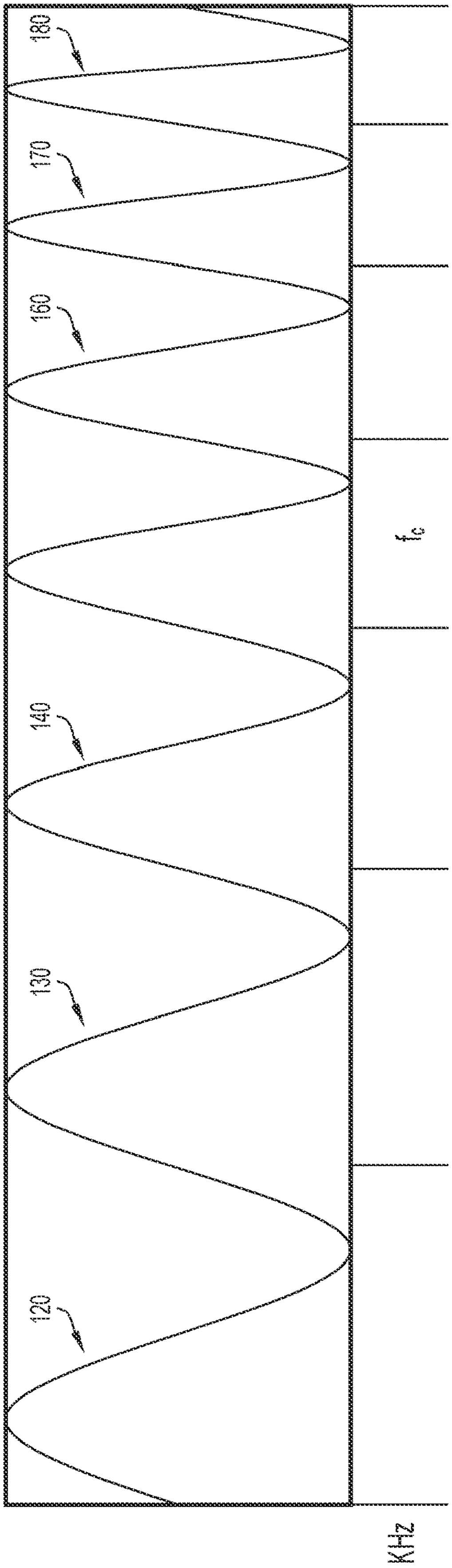
FIG. 12B is a diagram of the second narrow frequency chirp pulse referred to in FIG. 11, according to an example embodiment.

Reference is now made to FIGS. 11, 12A and 12B. FIG. 11 illustrates a flow chart for an impedance-based fault detection process 1100 that uses two types of chirp pulses: a broad chirp pulse, shown in FIG. 12A, that has more frequencies and spans a wider frequency range and a focused chirp pulse, shown in FIG. 12B, that has fewer frequencies and spans a narrower frequency range around a particular frequency. This process may be performed by a digital fuse at the power transmitter side, power receiver side, or both the power transmitter and power receiver sides.

At step 1110, the fault detection process 1100 begins by initiating a PoE or low voltage startup power (e.g., 48 V). Once startup completes, then at step 1120, the DSP transmits a broad chirp pulse on the wire carrying the power. As shown in FIG. 12A, the broad chirp pulse 1200 may include an 11 frequency sequence (of sinewaves) from 50 kHz to 550 kHz in 50 kHz increments. While the sequence is shown as a sequence of sinewaves, this is not meant to be limiting. The chirp pulse can consist of other waveform types and may include more or fewer frequencies. Moreover, the order of the frequencies can be other than increasing; it could be decreasing from highest frequency to lowest frequency (as shown in FIG. 3D), alternating, random, etc.

At step 1122, the DSP obtains the signal on the wire. At step 1130, the DSP analyzes the signal at the frequencies of the broad chirp pulse 1200, and determines whether there is at least a preliminary indication of an impedance-based fault at any one or more of the frequencies of the broad chirp pulse 1200. If there is no indication of an impedance-based fault at any of the frequencies of the broad chirp pulse 1200, then at 1132, the higher voltage power is started and then the process goes back to step 1120 for transmitting a broad chirp pulse onto the wire carrying the power, which is now at a full higher voltage power level. The operations at step 1132 may include a power negotiation process, as described below in connection with FIG. 14.

If, at step 1130, the DSP determines that there is a preliminary indication of a fault at at least one frequency, then the process continues to step 1140. The frequency that is most indicative (strongest indication) of a fault is determined based on the operations described above in connection with FIG. 7, and this frequency is denoted $f_c$. At step 1140, the DSP transmits a narrower in frequency range, more focused, chirp pulse with frequencies centered around frequency $f_c$. FIG. 12B illustrates an example of a narrower/focused chirp pulse 1210. The frequency $f_c$ is shown, in this example to be 150 kHz, and the other frequencies of the chirp pulse 1210 are, for example, 120 kHz, 130 kHz, 140 kHz, 160 kHz, 170 kHz and 180 kHz; that is, 3 frequencies on the lower side of $f_c$ and 3 frequencies on the higher side of $f_c$. The number of frequencies and spacings of frequencies in the sequence in narrower/focused chirp pulse 1210 is only an example.

At step 1142, the DSP obtains a signal on the wire, and at step 1150, analyzes the signal at the frequencies of the narrower/focused chirp pulse 1210 to determine whether there is an indication of an impedance-based fault. If the DSP analyzes the received signal from the narrower/focused chirp pulse 1210 and determines that there is no indication of an impedance-based fault at any of the other frequencies around $f_c$, then a count of false detections during a predetermined time interval (e.g., 100 msec) is incremented at step 1160. At step 1162, the DSP determines whether the false detection counts (during the predetermined time interval) exceed a false count threshold. If the false count threshold is not exceeded, then the process continues at step 1120. In one example, a suitable false count threshold may be 20 in a 10 msec window.

If, at step 1150, the DSP determines that there is an indication of a fault at one or more other frequencies of the narrower/focused chirp pulse or if the false count threshold in step 1162 is exceeded, then the process goes to step 1170 where a fault is declared. When step 1170 is reached, the FETs connecting to the send and return wires are turned off (as described above in connection with FIGS. 9 and 10), and the power transmitter (or power receiver, or both) initiate a reset and restart (such as returning to step 1110).

Figure 13:
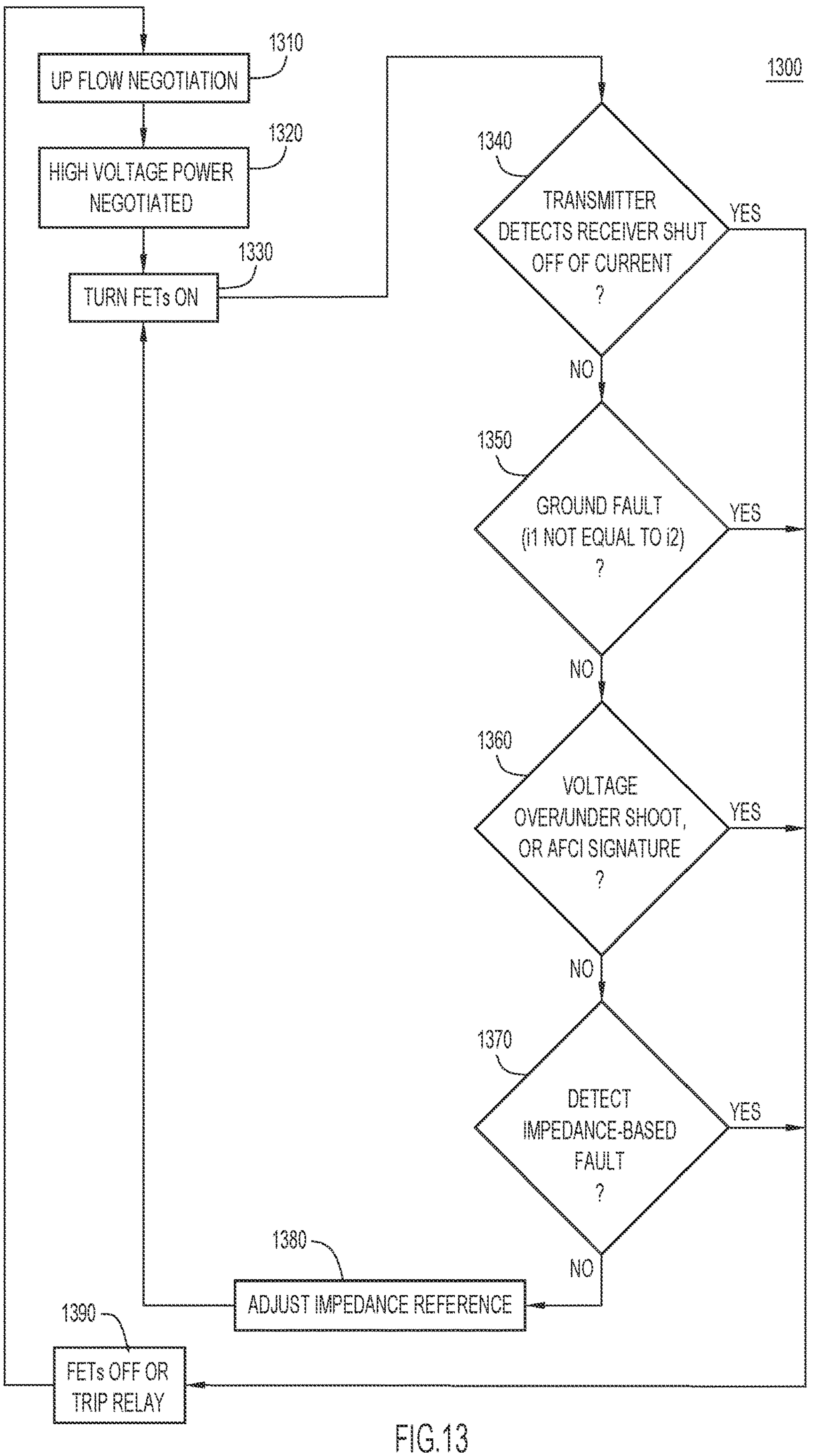
FIG. 13 is a flow chart of a comprehensive fault detection process that includes the impedance-based fault detection techniques presented herein, according to an example embodiment.

Reference is now made to FIG. 13, which illustrates a flow chart for a comprehensive fault process 1300, of which the digital fuse/impedance-based fault detection techniques are a part. This comprehensive fault detection process 1300 is applicable at both the power transmitter side and power receiver side. At step 1310, negotiation of the power between the power transmitter and power receiver is performed. At step 1320, based on the outcome of the negotiation at step 1310, the particular high voltage power is initiated. Any of the aforementioned power types may be negotiated and initiated at steps 1310 and 1320. At step 1330, the FETs (or relay in the case of AC power) at the power transmitter (and power receiver) are turned on, connecting the power transmitter and power receiver to the wires. With the FETs turned on, several different fault detections are performed. While these detections are shown in FIG. 13 as being performed in series, it is also envisioned that they may be performed in parallel. Moreover, it is also envisioned that the transmitter may apply one or a series of chirp pulses on the wire before applying the high voltage power on the wire in order to probe for an impedance-based fault to ensure the wire is safe before the high voltage power is even applied to the wire. This is also explained as part of the process shown in FIG. 14.

In any event, at step 1340, the power transmitter detects whether the power receiver has shut off current. This may be indicated by a current flow at the power transmitter transitioning to a value greater than a predetermined threshold (after startup), such as 10 milliamps. If no such detection is made, then at 1350, detection is made for a ground fault, which is indicated when current $i_1$ (current in the send wire) is not equal to the current $i_2$ (current in the receive wire), within a predetermined value (e.g., 15 milliamps) between the power transmitter and power receiver, as shown in FIGS. 4A and 4B. In other words, when the difference between current $i_1$ and the current $i_2$ is greater than the predetermined value, this is indicative of a ground fault.

Next, at step 1360, a detection is made for an arc fault, which can be indicated when the voltage has gone under or over a predetermined voltage by a predetermined amount, or a detection is made of an AFCI signature (by either of $DSP_1$ or $DSP_2$ shown in FIG. 4A).

Next, at step 1370, detection is made for an impedance-based fault using any of the techniques presented herein. If an impedance-based fault is not detected, at step 1380, an update may be made to the impedance reference (impedance at all of the chirp frequencies) that are used for ongoing comparisons with future impedance values at the chirp frequencies.

If any of the fault detections are made at steps 1340, 1350, 1360, or 1370, then at step 1390 the FETs are turned off (in the case of DC power) or a relay (electro-mechanical or solid state) is tripped in the case of AC power.

The comprehensive fault detection process may be invoked at the transmit side only for some applications. For example, a power transmitter may do probing of a wire for a fault (e.g., first send a chirp pulse (or series of chirp pulses)) before applying high voltage on the wire without any operations needed to be performed by the power receiver. This is applicable for DC and AC power. That is, the power transmitter can probe a wire for a fault using one or more chirp pulses when energizing an AC power circuit before applying the AC power.

Figure 14:
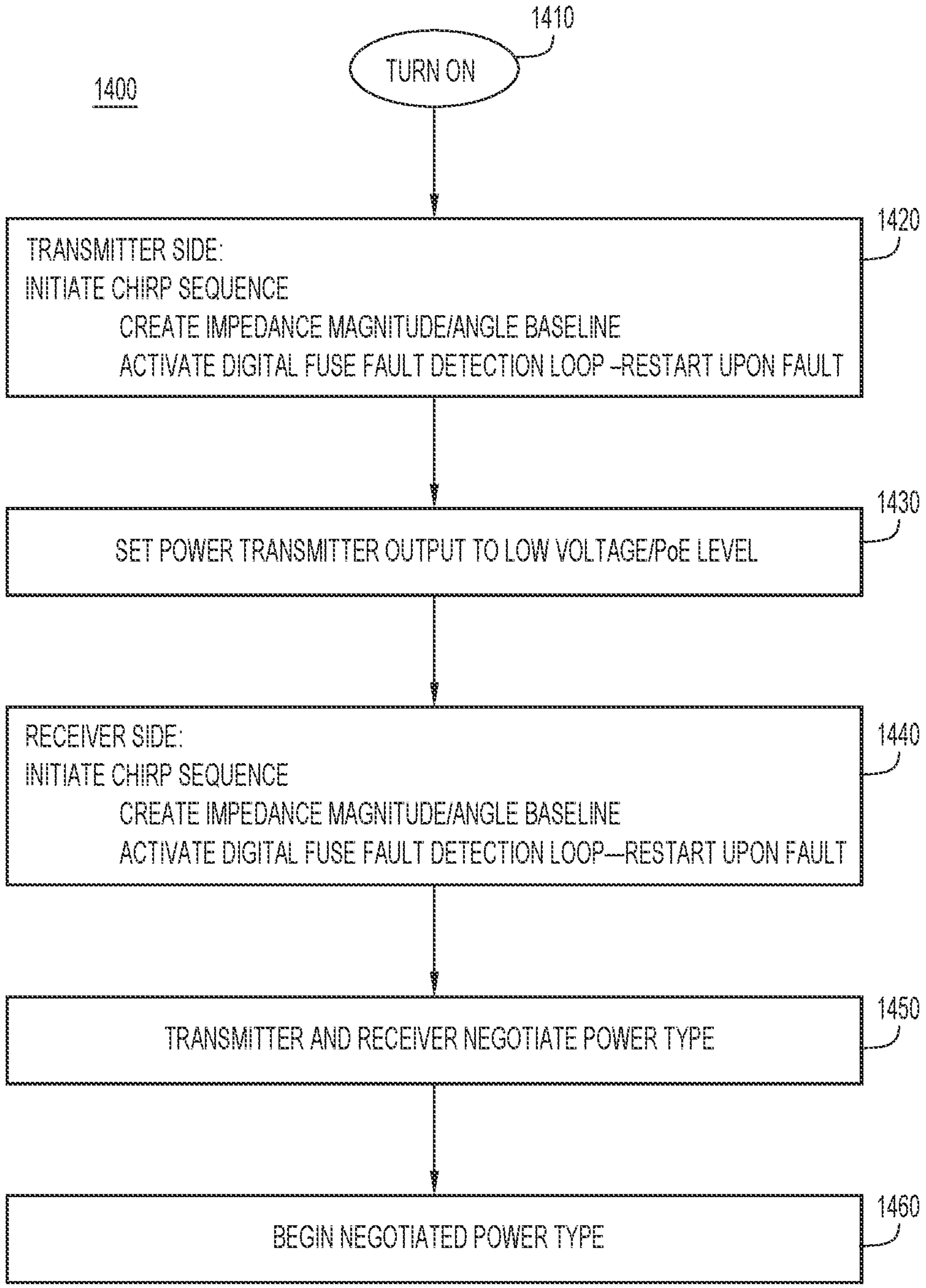
FIG. 14 is a flow chart of a power startup process according to an example embodiment.

Reference is now made to FIG. 14, which illustrates a flow chart for a power startup process 1400 that includes impedance-based fault detection. At step 1410, both sides power on. At step 1420, at the transmitter side, the digital fuse chirp sequence is initiated and transmitted onto the wire. This allows the digital fuse on the transmitter side to create an impedance magnitude/angle baseline and to activate the digital fuse fault detection loop, described above. Notably, the power transmitter may perform impedance-based fault safety checks on the wires before active power transmission begins. At step 1430, the power transmitter sets its output to an initial low voltage/PoE level. At step 1440, the power receiver side initiates the chirp sequence, creates an impedance magnitude/angle baseline, and activates the digital fuse fault detection loop, as described above. At step 1450, the transmitter and receiver negotiate a power type. At step 1460, the power transmitter provides the negotiated power type to the power receiver. As explained above, using the digital fuse techniques, power can be delivered with better efficiency because it is always on; there is no need to have power pulse off periods in order to detect faults on the wires.

Based on the flow charts of FIGS. 13 and 14, a method may be provided that comprises: at a power transmitter, applying to a wire one or more chirp pulses each comprising a sequence of waveforms at a plurality of frequencies; analyzing an impedance of a signal on the wire from the one or more chirp pulses at two or more frequencies of the plurality of frequencies with respect to determine whether there is an indication of an impedance-based fault on the wire; and determining whether to apply relatively high power on the wire for delivery to a power receiver based on the analyzing.

The method may further involve the power transmitter applying a relatively low level startup power on the wire. In this case, the applying and analyzing steps of the method may be performed before, during and/or after the relatively low level startup power is applied on the wire, and before the relatively high power is applied to the wire by the power transmitter.

The method may further include the power transmitter and the power receiver negotiating a type of the relatively high power to be applied to the wire by the power transmitter for delivery to the power receiver. In this case, the applying and analyzing steps may be continued to be performed after it is determined that there is no indication of an impedance-based fault on the wire and while the relatively high power is applied to the wire after completion by the power transmitter and the power receiver of negotiating the type of the relatively high power.

As depicted in FIG. 13, the method may further include performing a plurality of fault detections including: (a) power receiver shut off and disconnection from the wire as a result of a fault detected by the power receiver; (b) detection of a ground fault between the power transmitter and power receiver; and (c) detection of an over-voltage, under-voltage or arc fault circuit interrupt fault.

The method may further include, based on the applying and the analyzing steps, generating an impedance reference for use in analyzing an impedance of the signal obtained from the wire (as shown at step 1380 in FIG. 13).

As part of the method, the power receiver may perform its own digital fuse operations of: applying to the wire one or more chirp pulses each comprising a sequence of waveforms at a plurality of frequencies; analyzing an impedance of a signal on the wire from the one or more chirp pulses at two or more frequencies of the plurality of frequencies with respect to determine whether there is an indication of an impedance-based fault on the wire; and based on the analyzing, determining whether or not to connect to, or maintain a connection, of the power receiver to the wire from which the relatively high power on the wire is received by the power receiver.

Figure 15:
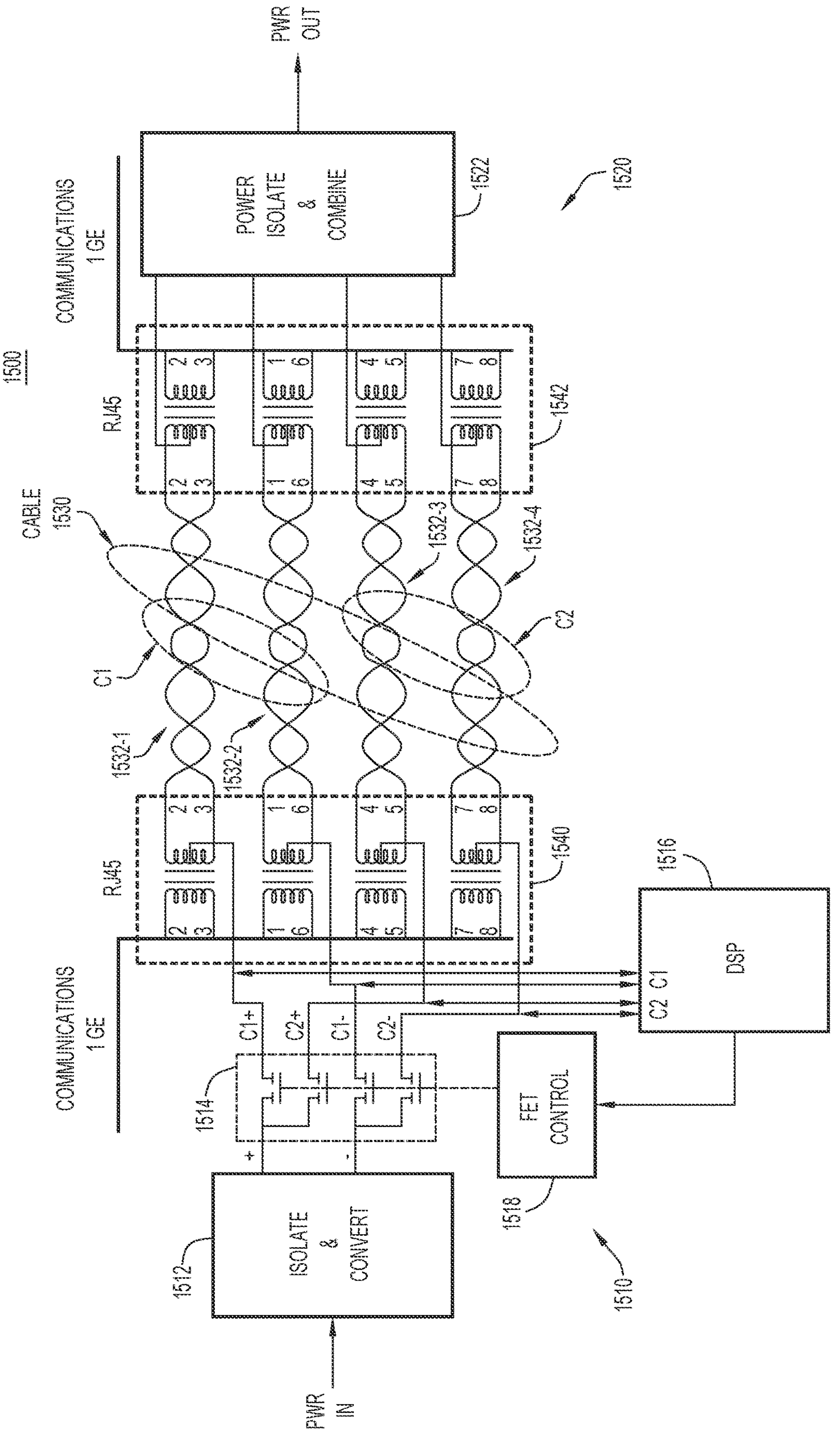
FIG. 15 is a block diagram of using the digital fuse techniques in a system that involves data communication and power transmission over a cable, according to an example embodiment.

Referring now to FIG. 15, a diagram is shown depicting use of the digital fuse techniques for a system 1500 involving power and communications over a cable, such as 1 Gigabit Ethernet (GE) communications over a CAT6 cable. The system 1500 includes a power transmitter 1510 and a power receiver 1520 in communication with each other over a cable 1530. The power transmitter 1510 includes a power isolation and converter 1512 that receives input power (PWR_IN), a plurality of FETs 1514, a DSP 1516 configured for impedance-based fault detection and a FET control circuit 1518. The power receiver 1520 includes a power isolation and combine block 1522 that produces output power (PWR_OUT). It is not necessary that the power at the receiver be isolated. The cable 1530 is, for example, a 24 AWG CAT6 cable that includes 4 wire pairs 1532-1, 1532-2, 1532-3 and 1532-4, with each wire in the wire pair labeled as shown in the figure. There is a registered jack (RJ) 45 connector 1540 connected to the cable 1530 at the transmit side and a RJ-45 connector 1542 connected to the cable 1530 at the receive side. The plurality of FETs 1514 include a FET for each wire pair of the cable 1530. Power at the power transmitter is split over two phases, but this is only an example.

The plurality of FETs 1514 are shown connected to wires on the power side of the magnetics, but it is also possible that the DSP 1516 be connected to wires 1, 2, 3, 4, 5, 6, 7 and 8 of the cable.

The system 1500 shown in FIG. 15 supports a method that involves: applying power to each of a plurality of wire pairs of a cable; transmitting and receiving data over the plurality of wire pairs of the cable; applying onto the plurality of wire pairs a chirp pulse comprising a sequence of waveforms of a plurality of frequencies; obtaining signals from the plurality of wire pairs; analyzing an impedance of the signals obtained from the plurality of wire pairs at two or more frequencies of the plurality of frequencies with respect to a reference impedance to determine whether there is an indication of an impedance-based fault on a given wire pair of the plurality of wire pairs; and disconnecting the power from the given wire pair in response to determining an indication of the impedance-based fault.

All the aforementioned techniques for applying chirp pulses and analyzing signals on the wire described above in connection with FIGS. 1, 2A, 2B, 3A-3E, 4A, 4B, 5-8, 9A, 9B, 10, 11, 12A, 12B, 13 and 14 may be used in connection with the system 1500 depicted in FIG. 15.

Figure 16:
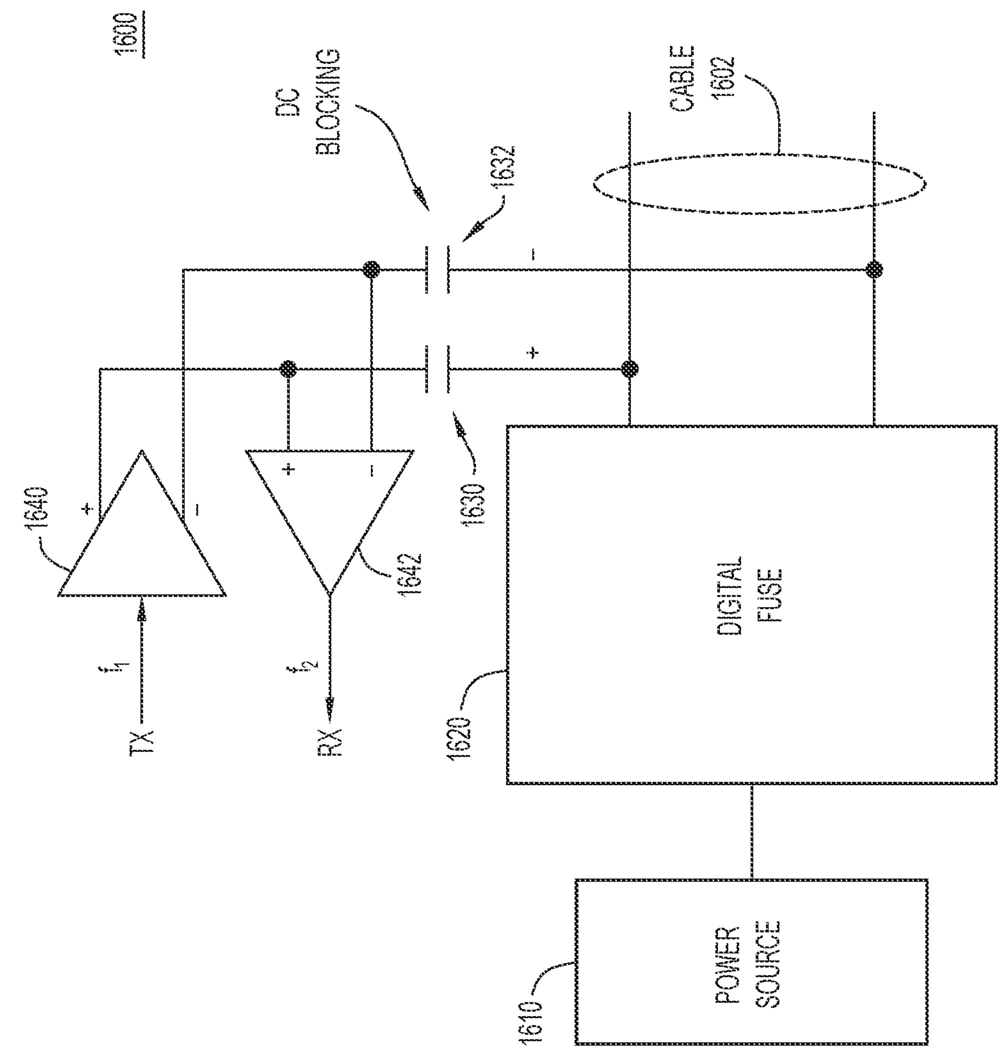
FIG. 16 is a block diagram of a system arrangement to perform dual band communications over a cable that is protected from faults with the digital fuse techniques presented herein, according to an example embodiment.

Turning now to FIG. 16, a diagram is shown of a system 1600 that supports differential bi-directional dual band communications over a cable for which the digital fuse techniques are employed. The system 1600 is shown at one end of a cable 1602, e.g., a power transmitter side, where a power source 1610 is provided that provides power onto the cable via a digital fuse 1620. The digital fuse 1620 may comprise, for example, the digital fuse circuit arrangement shown in FIGS. 4A and 4B. Bi-directional dual band communications over the cable 1602 is achieved by DC-blocking/coupling capacitors 1630 and 1632 coupled between wires of the cable and a transmitter 1640 that transmits on frequency $f_1$ and a receiver 1642 that receives on receive $f_2$. While FIG. 16 shows the capacitive coupling arrangement only at one side (power transmitter side) of the cable 1602, it is to be understood that the other side of the cable (power receiver side) would have a similar arrangement. Thus, FIG. 16 illustrates a basic communications method that can be deployed because the power is not being periodically shut off by fault detection circuitry, and instead can be continuously applied. The communications made over frequencies $f_1$ and $f_2$ (unrelated to the waveform frequencies of a chirp pulse) may be part of continuous asynchronous digital subscriber line (ADSL) communications or 8b/10b encoded bidirectional signaling that can be deployed over the cable 1602 because the fault detection is not interrupting power that causes significant communications errors during the power on and off transition times of pulse power.

All the aforementioned techniques for applying chirp pulses and analyzing signals on the wire described above in connection with FIGS. 1, 2A, 2B, 3A-3E, 4A, 4B, 5-8, 9A, 9B, 10, 11, 12A, 12B, 13-15 may be used in connection with the system 1600 depicted in FIG. 16.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

To the extent that embodiments presented herein relate to the storage of data, the embodiments may employ any number of conventional or other databases, data stores or storage structures (e.g., files, databases, data structures, data or other repositories, etc.) to store information.

As used herein, unless expressly stated to the contrary, use of the phrase 'at least one of', 'one or more of', 'and/or', variations thereof, or the like are open-ended expressions that are both conjunctive and disjunctive in operation for any and all possible combinations of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

In some aspects, the techniques described herein relate to a method including: applying power to a wire of a power delivery system; applying onto the wire a chirp pulse including a sequence of waveforms of a plurality of frequencies; obtaining a signal on the wire; analyzing an impedance of the signal at two or more frequencies of the plurality of frequencies with respect to a reference impedance to determine whether there is an indication of an impedance-based fault in the power delivery system; and disconnecting the power from the wire in the power delivery system in response to determining an indication of the impedance-based fault.

In some aspects, the techniques described herein relate to a method, further including: continuously delivering power from a power transmitter to a power receiver over a cable that includes the wire, wherein the applying the chirp pulse, obtaining and analyzing are performed on an ongoing basis while the power is being delivered over the cable.

In some aspects, the techniques described herein relate to a method, wherein applying the chirp pulse includes repeatedly applying chirp pulses onto the wire while power is being applied to the wire.

In some aspects, the techniques described herein relate to a method, wherein applying the power is performed at a power transmitter to transmit power over the wire to a power receiver, and wherein applying the chirp pulse, detecting, analyzing and disconnecting are performed at (a) both the power transmitter and the power receiver; (b) the power transmitter; or (c) the power receiver.

In some aspects, the techniques described herein relate to a method, wherein analyzing includes analyzing, at each of the plurality of frequencies, impedance at a first time instant and impedance at a second time instant to determine the indication of the impedance-based fault.

In some aspects, the techniques described herein relate to a method, wherein analyzing includes comparing impedance at a current time instant with the reference impedance derived from impedance at a plurality of previous time instants to determine the indication of the impedance-based fault.

In some aspects, the techniques described herein relate to a method, where the applying the chirp pulse and analyzing are performed by a digital signal processor (DSP) that is connected to the wire.

In some aspects, the techniques described herein relate to a method, wherein: applying a chirp pulse includes applying a first chirp pulse comprising waveforms of a first plurality of frequencies spanning a first frequency range; analyzing includes first analyzing the signal based on the first chirp pulse to determine whether there is a preliminary indication of an impedance-based fault on the wire; when analyzing determines there is a preliminary indication of the impedance-based fault at two or more of the first plurality of frequencies, further including: applying a second chirp pulse comprising waveforms of a second plurality of frequencies centered around a particular frequency of the first plurality of frequencies, wherein the second plurality of frequencies is less than the first plurality of frequencies; and second analyzing the signal based on the second chirp pulse to determine whether there is an indication of an impedance-based fault at two or more frequencies of the second plurality of frequencies, wherein disconnecting includes disconnecting the power from the wire in response to determining there is an indication of the impedance-based fault at two or more frequencies of the second plurality of frequencies.

In some aspects, the techniques described herein relate to a method, wherein the particular frequency is one of the first plurality of frequencies determined to have a strongest indication of an impedance-based fault.

In some aspects, the techniques described herein relate to a method, wherein when analyzing the signal based on the second chirp pulse determines that there is no indication of an impedance-based fault, further including: incrementing a count of false fault detections; determining whether the count of false fault detections within a predetermined time interval exceeds a threshold; and when the count of false fault detections exceeds the threshold, performing the disconnecting of the power from the wire and performing a power restart.

In some aspects, the techniques described herein relate to a method, wherein applying the power includes applying any one of: AC power, relatively low voltage DC power, relatively high voltage DC power, Power over Ethernet (POE) power, or pulsed power including a series of pulses separated by off periods.

In some aspects, the techniques described herein relate to a method, wherein when the power is low voltage DC power or high voltage DC power, disconnecting includes deactivating a field effect transistor between the power and the wire.

In some aspects, the techniques described herein relate to a method, wherein when the power is AC power, disconnecting includes controlling a relay or triac device to disconnect the power from the wire.

In some aspects, the techniques described herein relate to a method, wherein the chirp pulse includes a sequence of sine waveforms at the plurality of frequencies.

In some aspects, the techniques described herein relate to a method, wherein the sequence of waveforms at the plurality of frequencies are arranged in time in descending frequency order from highest frequency first to lowest frequency last.

In some aspects, the techniques described herein relate to an apparatus including: a digital signal processor configured to be connected to a wire that carries power from a power transmitter to a power receiver, wherein the digital signal processor is configured to: apply onto the wire a chirp pulse including a sequence of waveforms at a plurality of frequencies; analyze an impedance of a signal on the wire at two or more frequencies of the plurality of frequencies with respect to a reference impedance to determine whether there is an indication of an impedance-based fault on the wire; and generate a disconnect control signal in response to determining an indication of the impedance-based fault; and a disconnect device coupled to the wire and responsive to the disconnect control signal to disconnect the power from the wire.

In some aspects, the techniques described herein relate to an apparatus, wherein the digital signal processor is configured to apply a plurality of bandpass filters and narrowband digital filters at each of the plurality of frequencies to the signal to derive an impedance at each of the plurality of frequencies.

In some aspects, the techniques described herein relate to an apparatus, wherein the digital signal processor is configured to repeatedly apply chirp pulses onto the wire while power is being applied to the wire.

In some aspects, the techniques described herein relate to an apparatus, wherein the digital signal processor is configured to: apply a first chirp pulse comprising waveforms at a first plurality of frequencies spanning a first frequency range; analyze the signal based on the first chirp pulse to determine whether there is a preliminary indication of an impedance-based fault on the wire; when a determination is made that there is a preliminary indication of the impedance-based fault at two or more of the first plurality of frequencies: apply a second chirp pulse comprising waveforms at a second plurality of frequencies centered around a particular frequency of the first plurality of frequencies, wherein the second plurality of frequencies is less than the first plurality of frequencies; analyze the signal based on the second chirp pulse to determine whether there is an indication of an impedance-based fault at two or more frequencies of the second plurality of frequencies; and disconnect the power from the wire in response to determining there is an indication of the impedance-based fault at two or more frequencies of the second plurality of frequencies.

In some aspects, the techniques described herein relate to an apparatus, wherein the particular frequency is one of the first plurality of frequencies determined to have a strongest indication of an impedance-based fault.

In some aspects, the techniques described herein relate to an apparatus, wherein the digital signal processor is configured to, when it is determined that based on the second chirp pulse there is no indication of an impedance-based fault: increment a count of false fault detections; determine whether the count of false fault detections within a predetermined time interval exceeds a threshold; and when the count of false fault detections exceeds the threshold, disconnect the power from the wire and perform a power restart.

In some aspects, the techniques described herein relate to an apparatus, wherein the waveforms at the plurality of frequencies are arranged in time in descending frequency order from highest frequency first to lowest frequency last.

In some aspects, the techniques described herein relate to a method including: at a power transmitter, applying to a wire one or more chirp pulses each including a sequence of waveforms at a plurality of frequencies; analyzing an impedance of a signal on the wire from the one or more chirp pulses at two or more frequencies of the plurality of frequencies with respect to a reference impedance to determine whether there is an indication of an impedance-based fault on the wire; and determining whether to apply relatively high power on the wire for delivery to a power receiver based on the analyzing.

In some aspects, the techniques described herein relate to a method, further including the power transmitter applying a relatively low level startup power on the wire.

In some aspects, the techniques described herein relate to a method, further including applying and analyzing being performed before, during and/or after the relatively low level startup power is applied on the wire, and before the relatively high power is applied to the wire by the power transmitter.

In some aspects, the techniques described herein relate to a method, further including the power transmitter and the power receiver negotiating a type of the relatively high power to be applied to the wire by the power transmitter for delivery to the power receiver.

In some aspects, the techniques described herein relate to a method, wherein the applying and analyzing are continued to be performed after it is determined that there is no indication of an impedance-based fault on the wire and while the relatively high power is applied to the wire after completion by the power transmitter and the power receiver of negotiating the type of the relatively high power.

In some aspects, the techniques described herein relate to a method, further including performing a plurality of fault detections including: (a) power receiver shut off and disconnection from the wire as a result of a fault detected by the power receiver; (b) detection of a ground fault between the power transmitter and power receiver; and (c) detection of an over-voltage, under-voltage or arc fault circuit interrupt fault.

In some aspects, the techniques described herein relate to a method, further including: based on the applying and the analyzing, generating an impedance reference for use in analyzing an impedance of the signal obtained from the wire.

In some aspects, the techniques described herein relate to a method, further including, at the power receiver: applying to the wire one or more chirp pulses each including a sequence of waveforms at a plurality of frequencies; analyzing an impedance of a signal on the wire from the one or more chirp pulses at two or more frequencies of the plurality of frequencies with respect to determining whether there is an indication of an impedance-based fault on the wire; and based on the analyzing, determining whether or not to connect to, or maintain a connection, of the power receiver to the wire from which the relatively high power on the wire is received by the power receiver.

In some aspects, the techniques described herein relate to a method including: applying power to each of a plurality of wire pairs of a cable; transmitting and receiving data over the plurality of wire pairs of the cable; applying onto the plurality of wire pairs a chirp pulse including a sequence of waveforms of a plurality of frequencies; obtaining signals from the plurality of wire pairs; analyzing an impedance of the signals obtained from the plurality of wire pairs at two or more frequencies of the plurality of frequencies with respect to a reference impedance to determine whether there is an indication of an impedance-based fault on a given wire pair of the plurality of wire pairs; and disconnecting the power from the given wire pair in response to determining an indication of the impedance-based fault.

In some aspects, the techniques described herein relate to a method, wherein applying the chirp pulse comprises repeatedly applying chirp pulses onto a wire of each of the plurality of wire pairs while power is being applied.

In some aspects, the techniques described herein relate to a method, wherein analyzing comprises comparing impedance at a current time instant with the reference impedance derived from impedance at a plurality of previous time instants to determine the indication of the impedance-based fault.

In some aspects, the techniques described herein relate to a method, wherein the sequence of waveforms at the plurality of frequencies are arranged in time in descending frequency order from highest frequency first to lowest frequency last.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained by one skilled in the art and it is intended that the present disclosure encompass all such changes, substitutions, variations, alterations, and/or modifications as falling within the scope of the appended claims.

What is claimed is:

1. A method comprising:

applying power to a wire of a power delivery system;

applying onto the wire, successive chirp pulses, each chirp pulse comprising a sequence of waveforms of a plurality of frequencies and successive chirp pulses being separated in time by a quiet period;

obtaining a signal on the wire resulting from the successive chirp pulses;

analyzing an impedance of the signal at two or more frequencies of the plurality of frequencies, wherein analyzing comprises determining, at each of the two or more frequencies, at least one of an impedance magnitude or an impedance phase of the signal at that frequency, and comparing the impedance magnitude or the impedance phase at each of the two or more frequencies with respect to a reference impedance derived from the signal on the wire to determine whether there is an indication of an impedance-based fault in the power delivery system; and disconnecting the power from the wire in the power delivery system in response to determining an indication of the impedance-based fault.

2. The method of claim 1, further comprising:

continuously delivering power from a power transmitter to a power receiver over a cable that includes the wire, wherein the applying the successive chirp pulses, obtaining and analyzing are performed on an ongoing basis while the power is being delivered over the cable.

3. The method of claim 1, wherein applying the successive chirp pulses comprises repeatedly applying chirp pulses onto the wire while power is being applied to the wire.

4. The method of claim 1, wherein applying the power is performed at a power transmitter to transmit power over the wire to a power receiver, and wherein applying the successive chirp pulses, analyzing and disconnecting are performed at (a) both the power transmitter and the power receiver; (b) the power transmitter; or (c) the power receiver.

5. The method of claim 1, wherein analyzing comprises analyzing, at each of the plurality of frequencies, impedance at a first time instant and impedance at a second time instant to determine the indication of the impedance-based fault.

6. The method of claim 1, wherein analyzing comprises comparing impedance at a current time instant with the reference impedance derived from impedance at a plurality of previous time instants to determine the indication of the impedance-based fault.

7. The method of claim 1, where the applying the successive chirp pulses and the analyzing are performed by a digital signal processor (DSP) that is connected to the wire.

8. The method of claim 1, wherein:

applying successive chirp pulses comprises applying a first chirp pulse comprised of waveforms of a first plurality of frequencies spanning a first frequency range;

analyzing comprises first analyzing the signal based on the first chirp pulse to determine whether there is a preliminary indication of an impedance-based fault on the wire;

when analyzing determines there is a preliminary indication of the impedance-based fault at two or more of the first plurality of frequencies, further comprising:

applying a second chirp pulse, separated in time from the first chirp pulse by the quiet period, the second chirp pulse comprised of waveforms of a second plurality of frequencies centered around a particular frequency of the first plurality of frequencies, wherein the second plurality of frequencies is less than the first plurality of frequencies; and second analyzing the signal based on the second chirp pulse to determine whether there is an indication of an impedance-based fault at two or more frequencies of the second plurality of frequencies, wherein disconnecting comprises disconnecting the power from the wire in response to determining there is an indication of the impedance-based fault at two or more frequencies of the second plurality of frequencies.

9. The method of claim 8, wherein the particular frequency is one of the first plurality of frequencies determined to have a strongest indication of an impedance-based fault.

10. The method of claim 8, wherein when analyzing the signal based on the second chirp pulse determines that there is no indication of an impedance-based fault, further comprising:

incrementing a count of false fault detections;

determining whether the count of false fault detections within a predetermined time interval exceeds a threshold; and when the count of false fault detections exceeds the threshold, performing the disconnecting of the power from the wire and performing a power restart.

11. The method of claim 1, wherein applying the power comprises applying any one of: AC power, relatively low voltage DC power, relatively high voltage DC power, Power over Ethernet (POE) power, or pulsed power comprising a series of pulses separated by off periods.

12. The method of claim 11, wherein when the power is low voltage DC power or high voltage DC power, disconnecting comprises de-activating a field effect transistor between the power and the wire.

13. The method of claim 11, wherein when the power is AC power, disconnecting comprises controlling a relay or triac device to disconnect the power from the wire.

14. The method of claim 1, wherein each chirp pulse comprises a sequence of sine waveforms at the plurality of frequencies.

15. The method of claim 1, wherein the sequence of waveforms at the plurality of frequencies are arranged in time in descending frequency order from highest frequency first to lowest frequency last.

16. An apparatus comprising:

a digital signal processor configured to be connected to a wire that carries power from a power transmitter to a power receiver, wherein the digital signal processor is configured to:

apply onto the wire, successive chirp pulses, each chirp pulse comprising a sequence of waveforms at a plurality of frequencies and successive chirp pulses being separated in time by a quiet period;

obtain a signal on the wire resulting from the successive chirp pulses;

analyze an impedance of a signal at two or more frequencies of the plurality of frequencies by determining, at each of the two or more frequencies, at least one of an impedance magnitude or an impedance phase of the signal at that frequency, and comparing the impedance magnitude or the impedance phase at each of the two or more frequencies with respect to a reference impedance derived from the signal on the wire to determine whether there is an indication of an impedance-based fault on the wire; and generate a disconnect control signal in response to determining an indication of the impedance-based fault; and a disconnect device coupled to the wire and responsive to the disconnect control signal to disconnect the power from the wire.

17. The apparatus of claim 16, wherein the digital signal processor is configured to apply a plurality of bandpass filters and narrowband digital filters at each of the plurality of frequencies to the signal to derive an impedance at each of the plurality of frequencies.

18. The apparatus of claim 16, wherein the digital signal processor is configured to repeatedly apply successive chirp pulses onto the wire while power is being applied to the wire.

19. The apparatus of claim 16, wherein the digital signal processor is configured to:

apply a first chirp pulse comprised of waveforms at a first plurality of frequencies spanning a first frequency range;

analyze the signal based on the first chirp pulse to determine whether there is a preliminary indication of an impedance-based fault on the wire;

when a determination is made that there is a preliminary indication of the impedance-based fault at two or more of the first plurality of frequencies:

apply a second chirp pulse, separated in time from the first chirp pulse by the quiet period, the second chirp pulse comprised of waveforms at a second plurality of frequencies centered around a particular frequency of the first plurality of frequencies, wherein the second plurality of frequencies is less than the first plurality of frequencies;

analyze the signal based on the second chirp pulse to determine whether there is an indication of an impedance-based fault at two or more frequencies of the second plurality of frequencies; and generate the disconnect control signal to cause the disconnect device to disconnect the power from the wire in response to determining there is an indication of the impedance-based fault at two or more frequencies of the second plurality of frequencies.

20. The apparatus of claim 19, wherein the particular frequency is one of the first plurality of frequencies determined to have a strongest indication of an impedance-based fault.

21. The apparatus of claim 19, wherein the digital signal processor is configured to, when it is determined that based on the second chirp pulse there is no indication of an impedance-based fault:

increment a count of false fault detections;

determine whether the count of false fault detections within a predetermined time interval exceeds a threshold; and when the count of false fault detections exceeds the threshold, disconnect the power from the wire and performing a power restart.

22. The apparatus of claim 16, wherein the waveforms at the plurality of frequencies are arranged in time in descending frequency order from highest frequency first to lowest frequency last.

23. A method comprising:

at a power transmitter, applying to a wire successive chirp pulses, each chirp pulse comprising a sequence of waveforms at a plurality of frequencies and successive chirp pulses being separated in time by a quiet period;

obtaining a signal on the wire resulting from the successive chirp pulses;

analyzing an impedance of the signal on the wire resulting from the successive chirp pulses at two or more frequencies of the plurality of frequencies, wherein analyzing comprises determining, at each of the two or more frequencies, at least one of an impedance magnitude or an impedance phase of the signal at that frequency, and comparing the impedance magnitude or the impedance phase at each of the two or more frequencies with respect to a reference impedance to determine whether there is an indication of an impedance-based fault on the wire; and determining whether to apply relatively high power on the wire for delivery to a power receiver based on the analyzing.

24. The method of claim 23, further comprising the power transmitter applying a relatively low level startup power on the wire.

25. The method of claim 24, wherein the analyzing and the applying successive chirp pulses are performed before, during and/or after the relatively low level startup power is applied on the wire, and before the relatively high power is applied to the wire by the power transmitter.

26. The method of claim 25, further comprising the power transmitter and the power receiver negotiating a type of the relatively high power to be applied to the wire by the power transmitter for delivery to the power receiver.

27. The method of claim 26, wherein the applying successive chirp pulses and the analyzing are continued to be performed after it is determined that there is no indication of an impedance-based fault on the wire and while the relatively high power is applied to the wire after completion by the power transmitter and the power receiver of negotiating the type of the relatively high power.

28. The method of claim 27, further comprising performing a plurality of fault detections including: (a) power receiver shut off and disconnection from the wire as a result of a fault detected by the power receiver; (b) detection of a ground fault between the power transmitter and power receiver; and (c) detection of an over-voltage, under-voltage or arc fault circuit interrupt fault.

29. The method of claim 23, further comprising:

based on the applying and the analyzing, generating an impedance reference for use in analyzing an impedance of the signal obtained from the wire.

30. The method of claim 23, further comprising, at the power receiver:

applying to the wire one or more chirp pulses each comprising a sequence of waveforms at a plurality of frequencies;

analyzing an impedance of a signal on the wire from the one or more chirp pulses at two or more frequencies of the plurality of frequencies to determine whether there is an indication of an impedance-based fault on the wire; and based on the analyzing, determining whether or not to connect to, or maintain a connection, of the power receiver to the wire from which the relatively high power on the wire is received by the power receiver.

31. A method comprising:

applying power to each of a plurality of wire pairs of a cable;

transmitting and receiving data over the plurality of wire pairs of the cable;

applying onto the plurality of wire pairs successive chirp pulses, each chirp pulse comprising a sequence of waveforms of a plurality of frequencies and successive chirp pulses being separated in time by a quiet period;

obtaining signals from the plurality of wire pairs resulting from the successive chirp pulses;

analyzing an impedance of the signals obtained from the plurality of wire pairs at two or more frequencies of the plurality of frequencies, wherein analyzing comprises determining, at each of the two or more frequencies, at least one of an impedance magnitude or an impedance phase of the signals at that frequency, and comparing the impedance magnitude or the impedance phase at each of the two or more frequencies with respect to a reference impedance to determine whether there is an indication of an impedance-based fault on a given wire pair of the plurality of wire pairs; and disconnecting the power from the given wire pair in response to determining an indication of the impedance-based fault.

32. The method of claim 31, wherein applying successive chirp pulses comprises repeatedly applying chirp pulses onto a wire of each of the plurality of wire pairs while power is being applied.

33. The method of claim 31, wherein analyzing comprises comparing impedance at a current time instant with the reference impedance derived from impedance at a plurality of previous time instants to determine the indication of the impedance-based fault.

34. The method of claim 31, wherein the sequence of waveforms at the plurality of frequencies are arranged in time in descending frequency order from highest frequency first to lowest frequency last.

* * * * *